(12) United States Patent
Sills et al.

(10) Patent No.: US 12,526,976 B2
(45) Date of Patent: Jan. 13, 2026

(54) VERTICAL DIGIT LINES WITH ALTERNATING EPITAXIAL SILICON FOR HORIZONTAL ACCESS DEVICES IN 3D MEMORY

(71) Applicant: Micron Technology, Inc., Boise, ID (US)

(72) Inventors: Scott E. Sills, Boise, ID (US); Si-Woo Lee, Boise, ID (US); David K. Hwang, Boise, ID (US); Yoshitaka Nakamura, Boise, ID (US); Yuanzhi Ma, Boise, ID (US); Glen H. Walters, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 692 days.

(21) Appl. No.: 17/946,925

(22) Filed: Sep. 16, 2022

(65) Prior Publication Data

US 2024/0098970 A1   Mar. 21, 2024

(51) Int. Cl.
  *H01L 27/108* (2006.01)
  *H10B 12/00* (2023.01)
(52) U.S. Cl.
  CPC ............. *H10B 12/30* (2023.02); *H10B 12/48* (2023.02)
(58) Field of Classification Search
  CPC ........ H10B 12/30; H10B 12/48; H10B 12/03; H10B 12/482
  See application file for complete search history.

(56) References Cited

U.S. PATENT DOCUMENTS

| | | |
|---|---|---|
| 10,607,995 B2 | 3/2020 | Roberts et al. |
| 2018/0323200 A1 | 11/2018 | Tang et al. |
| 2019/0103406 A1 | 4/2019 | Tang et al. |
| 2019/0164985 A1 | 5/2019 | Lee et al. |
| 2021/0013226 A1 | 1/2021 | Tang et al. |
| 2022/0013524 A1* | 1/2022 | Ryu ........................ H10D 86/80 |

* cited by examiner

*Primary Examiner* — Mohammed R Alam
(74) *Attorney, Agent, or Firm* — Brooks, Cameron & Huebsch, PLLC

(57) ABSTRACT

Systems, methods and apparatus are provided for an array of vertically stacked memory cells having horizontally oriented access devices and storage nodes. The horizontally oriented access devices having a first source/drain regions and a second source drain regions separated by silicon (Si) channel regions. A digit line having a global digit line (GDL) contact is formed in a trench adjacent to the first source/drain regions. In one example, the digit line is electrically isolated from a neighboring digit line at the bottom of the trench. In another example, the digit line is formed continuously along a bottom surface of trench to form shared digit lines between horizontal access devices, in two separate arrays, on opposing second vertical surfaces. The memory cells have horizontally oriented storage nodes coupled to the second source/drain regions and vertical digit lines coupled to the first source/drain regions.

22 Claims, 31 Drawing Sheets

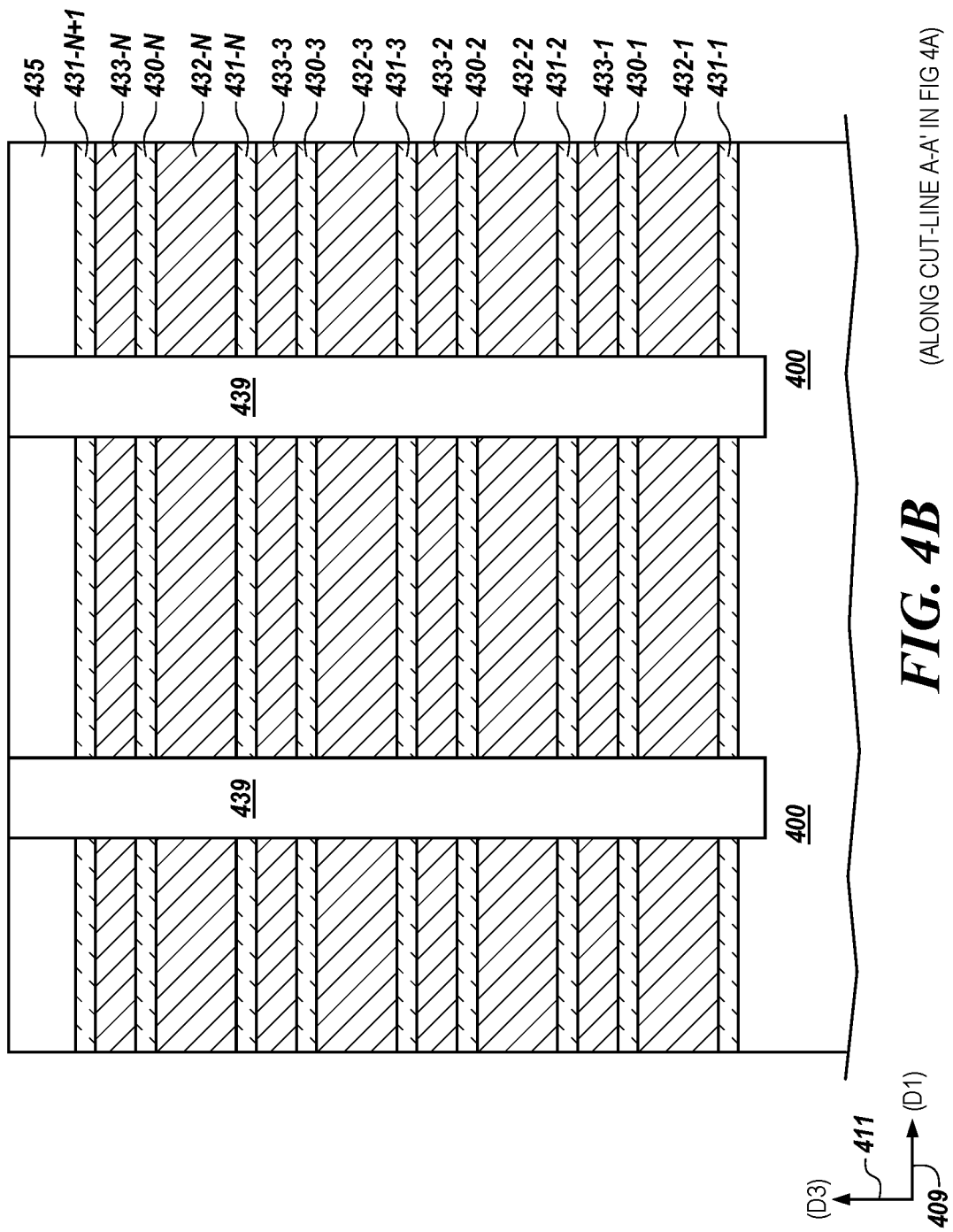
FIG. 4B (ALONG CUT-LINE A-A' IN FIG 4A)

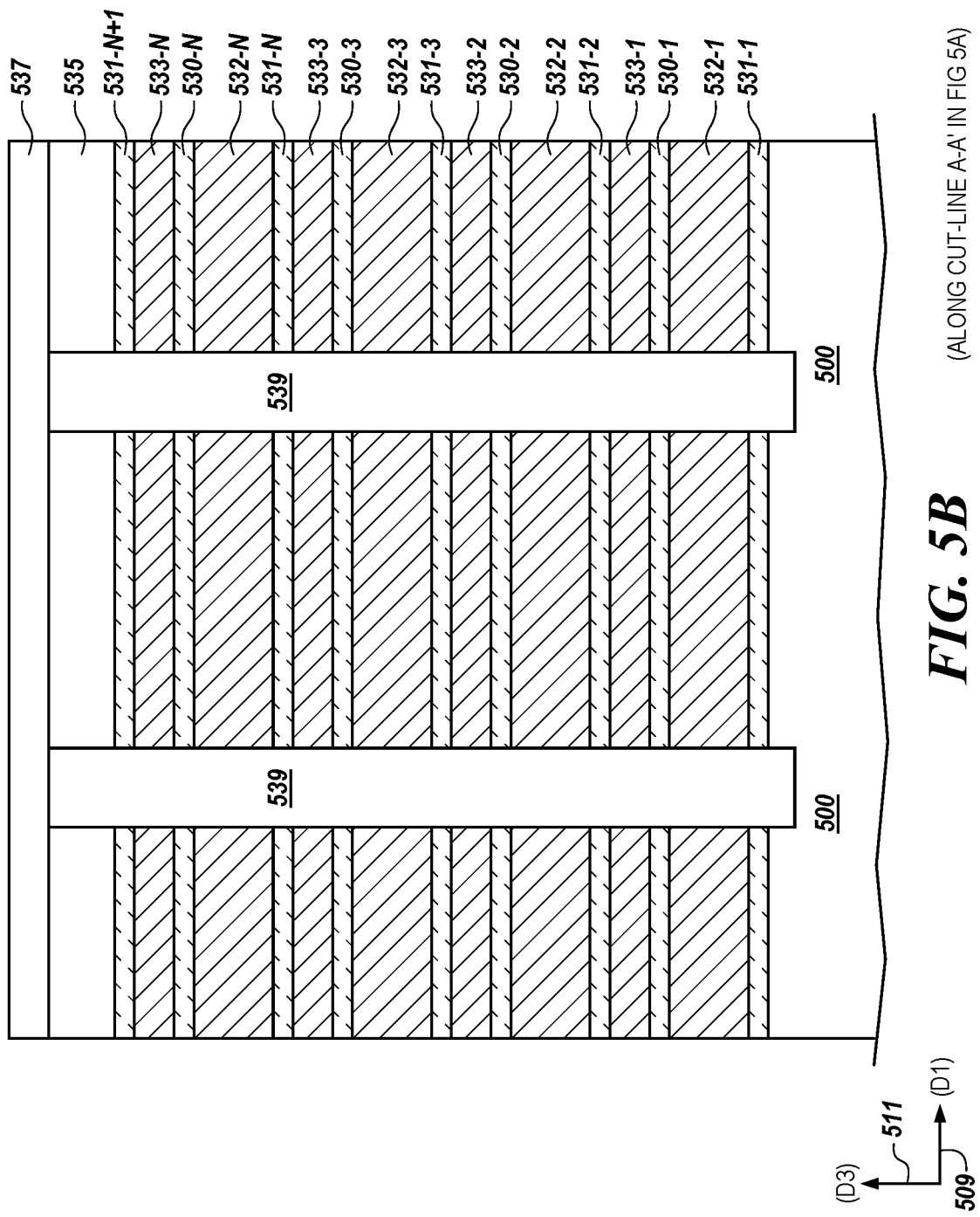
FIG. 5B (ALONG CUT-LINE A-A' IN FIG 5A)

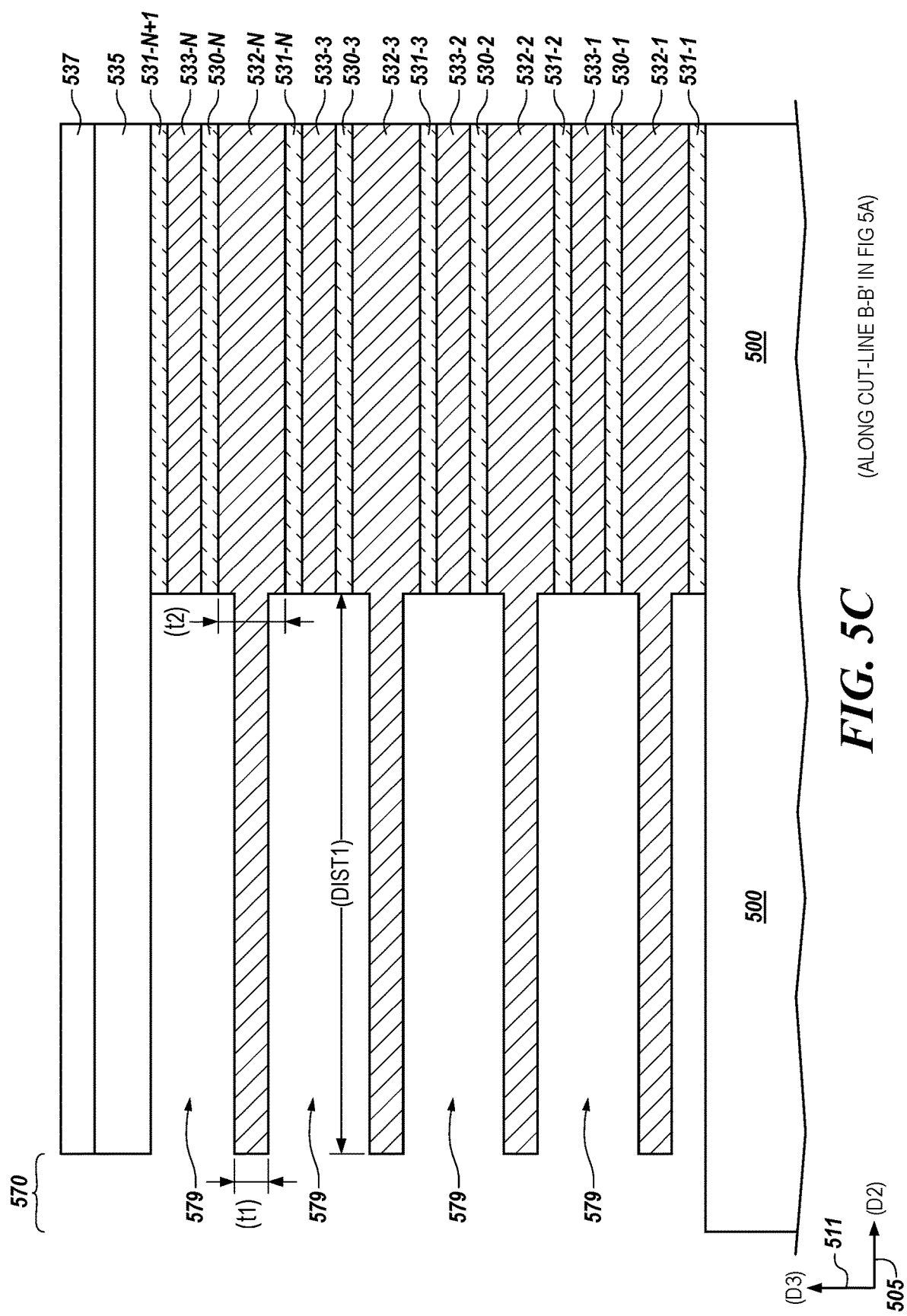
FIG. 5C (ALONG CUT-LINE B-B' IN FIG 5A)

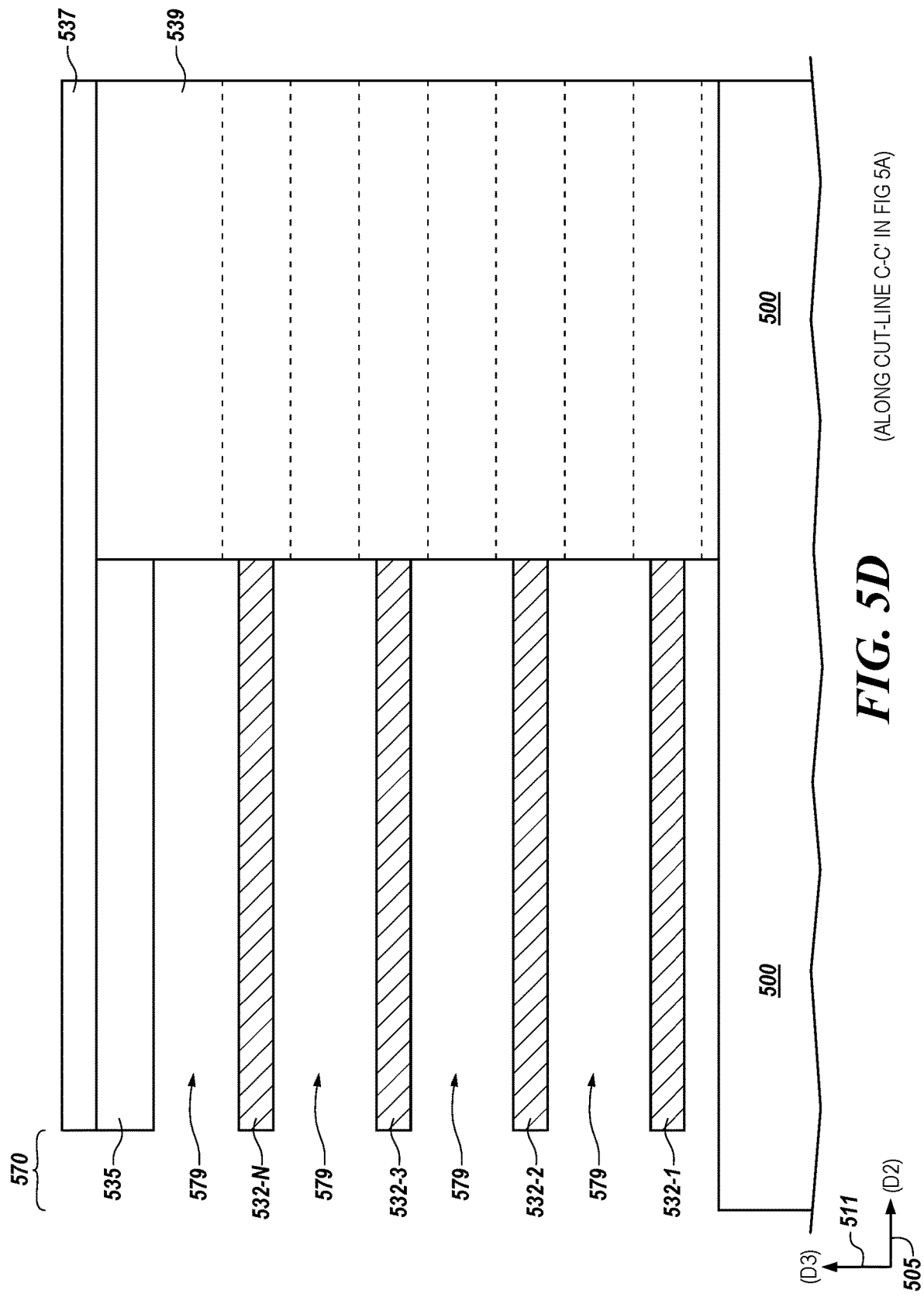
FIG. 5D (ALONG CUT-LINE C-C' IN FIG 5A)

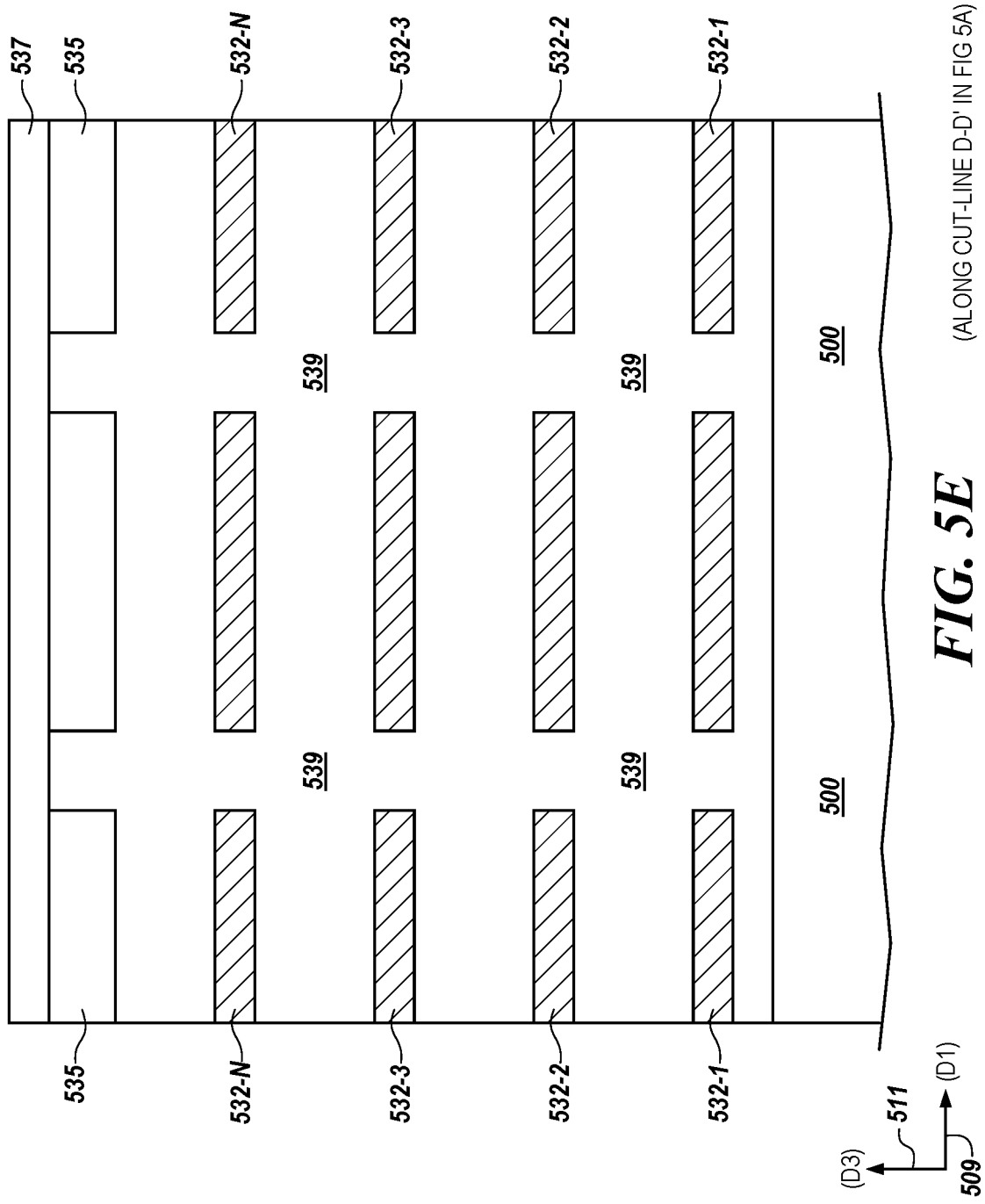
FIG. 5E (ALONG CUT-LINE D-D' IN FIG 5A)

(ALONG CUT-LINE A-A' IN FIG 6A)

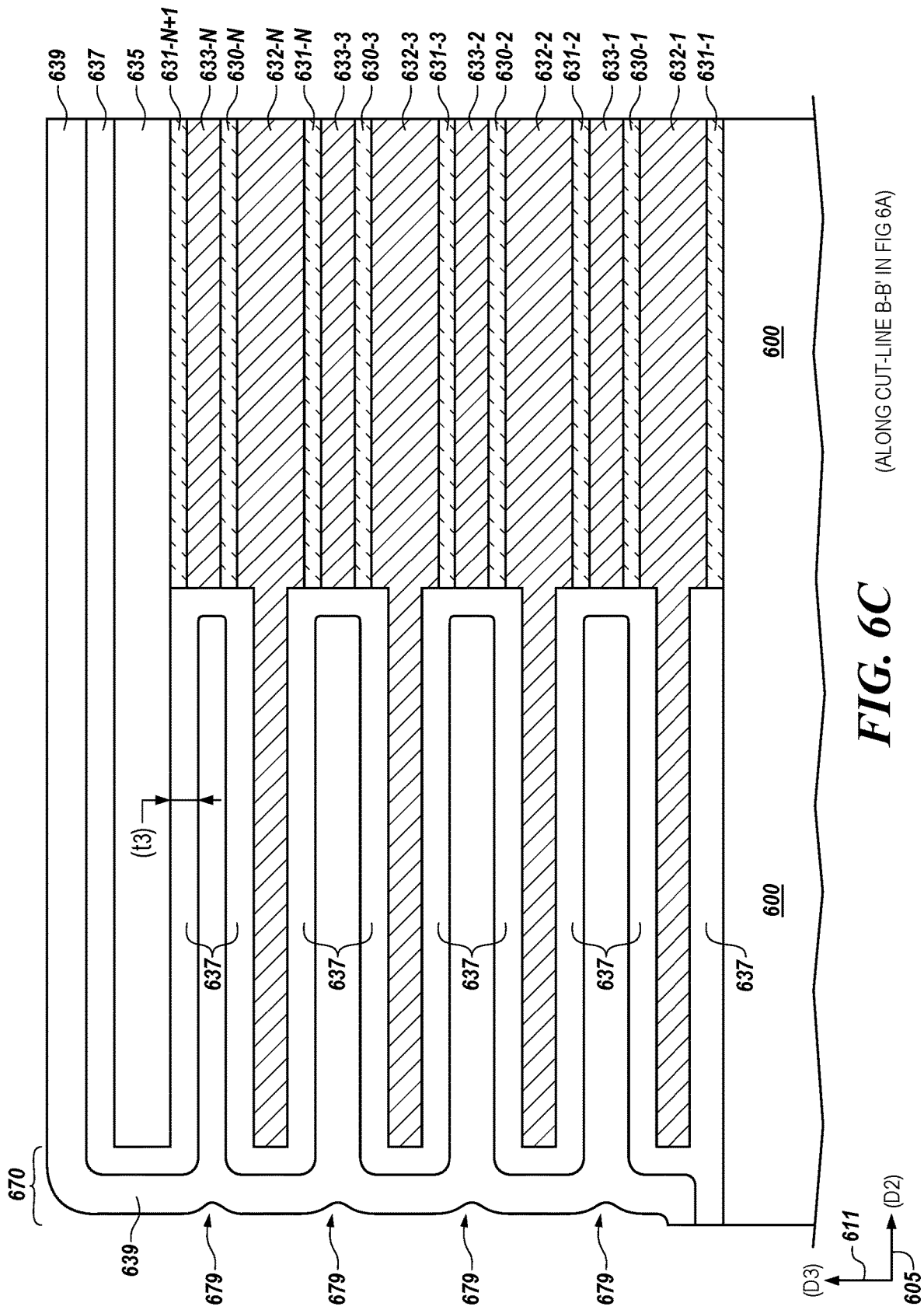
FIG. 6C (ALONG CUT-LINE B-B' IN FIG 6A)

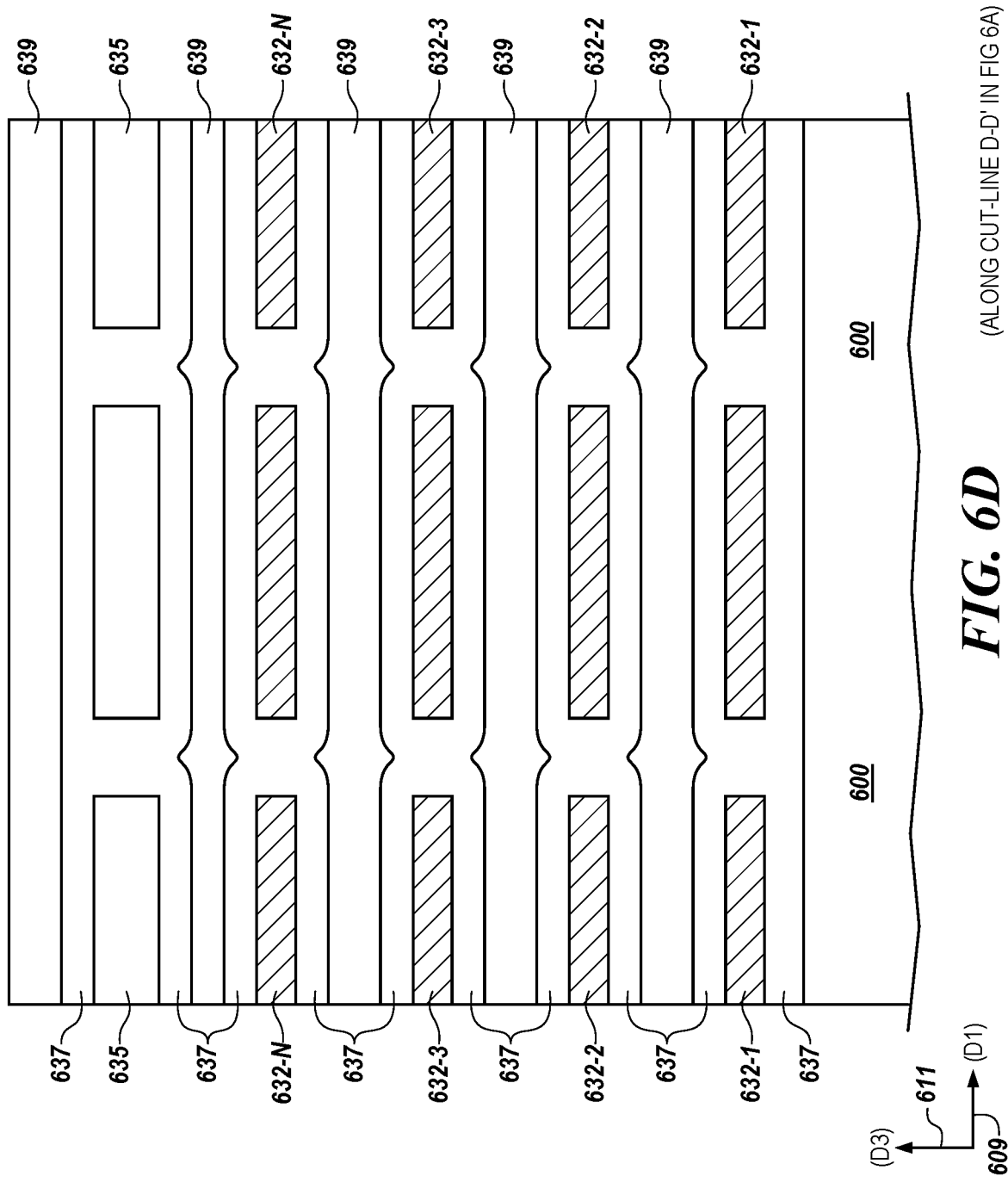
FIG. 6D (ALONG CUT-LINE D-D' IN FIG 6A)

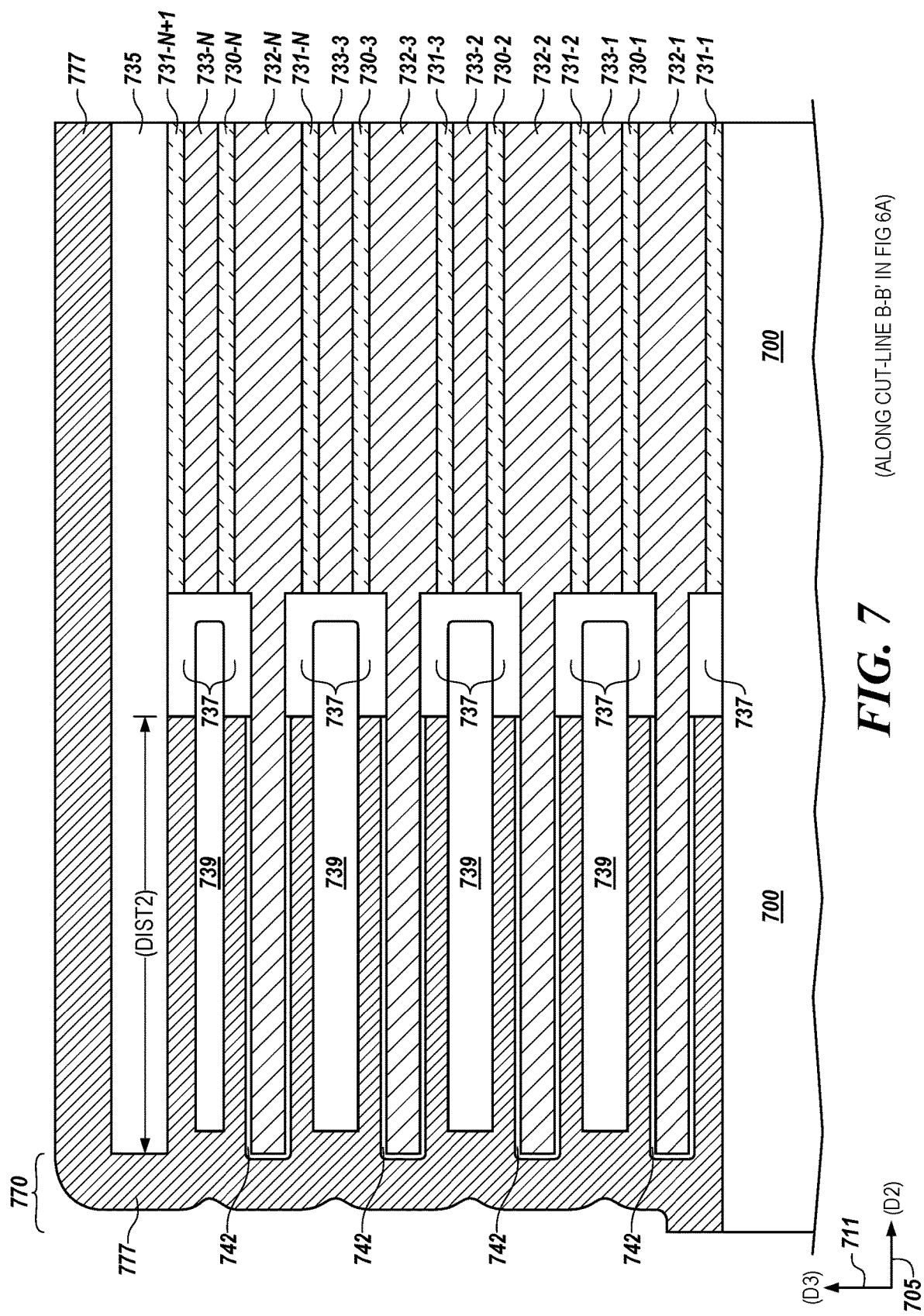
FIG. 7 (ALONG CUT-LINE B-B' IN FIG 6A)

(ALONG CUT-LINE B-B' IN FIG 6A)

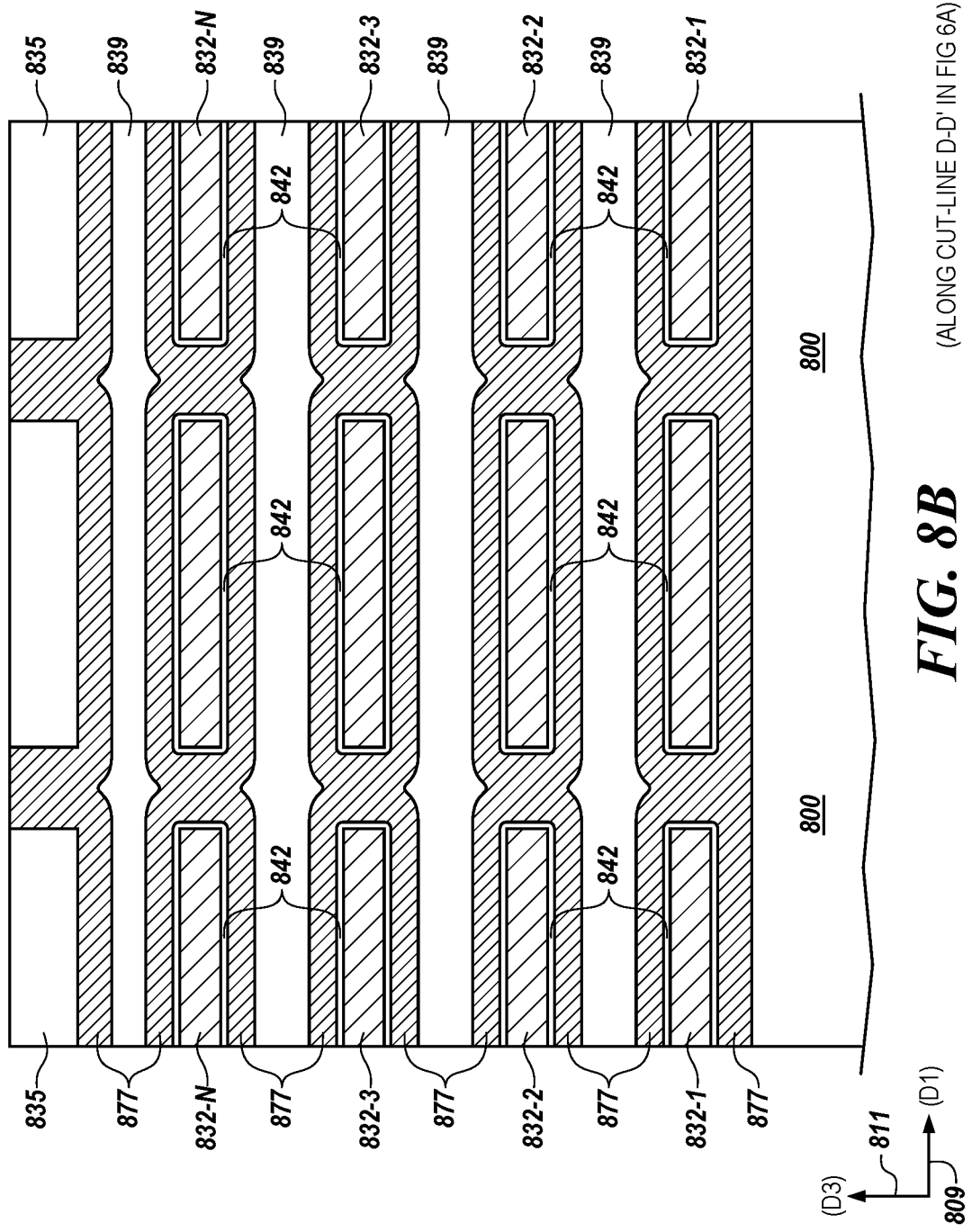
FIG. 8B (ALONG CUT-LINE D-D' IN FIG 6A)

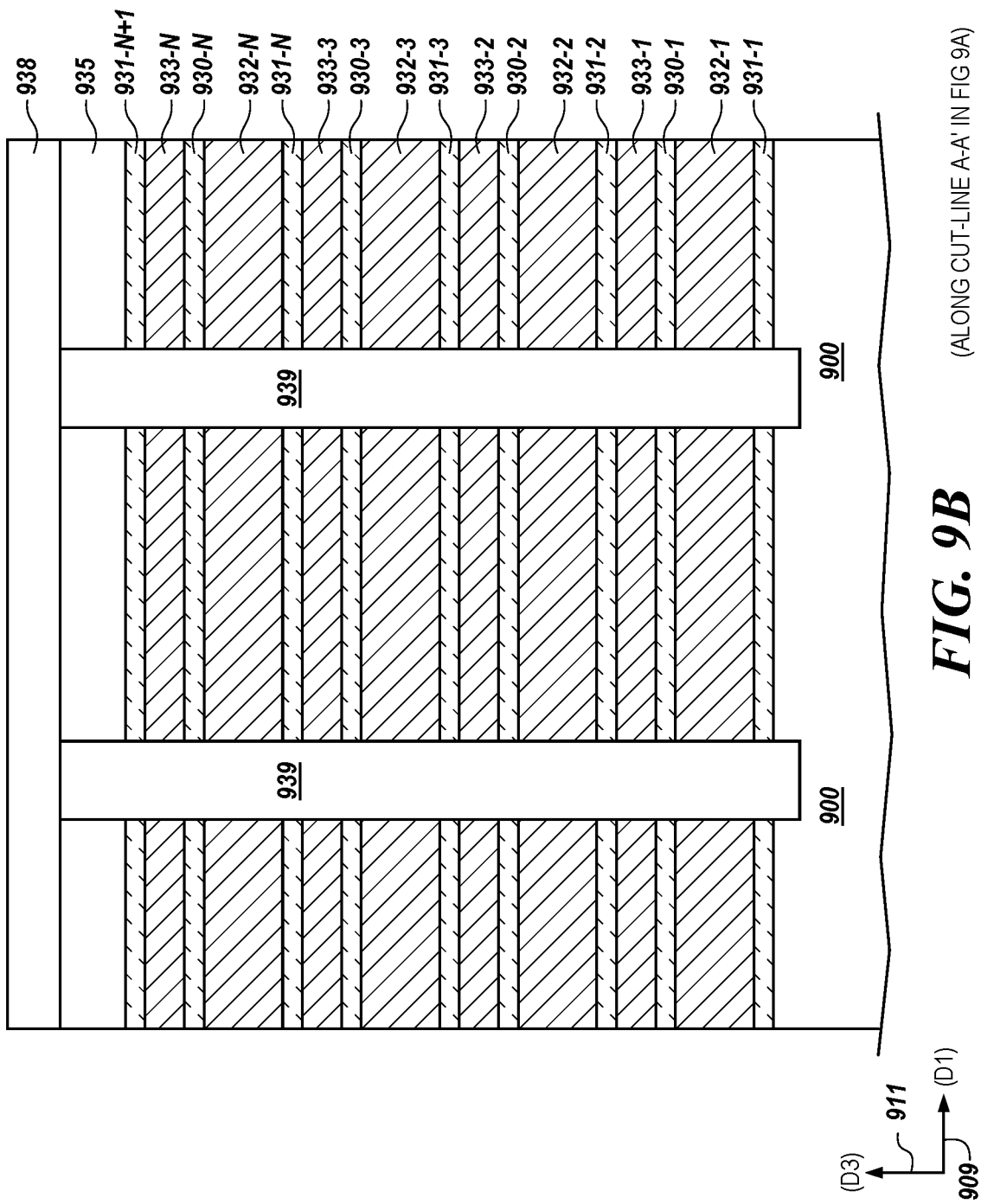
FIG. 9B (ALONG CUT-LINE A-A' IN FIG 9A)

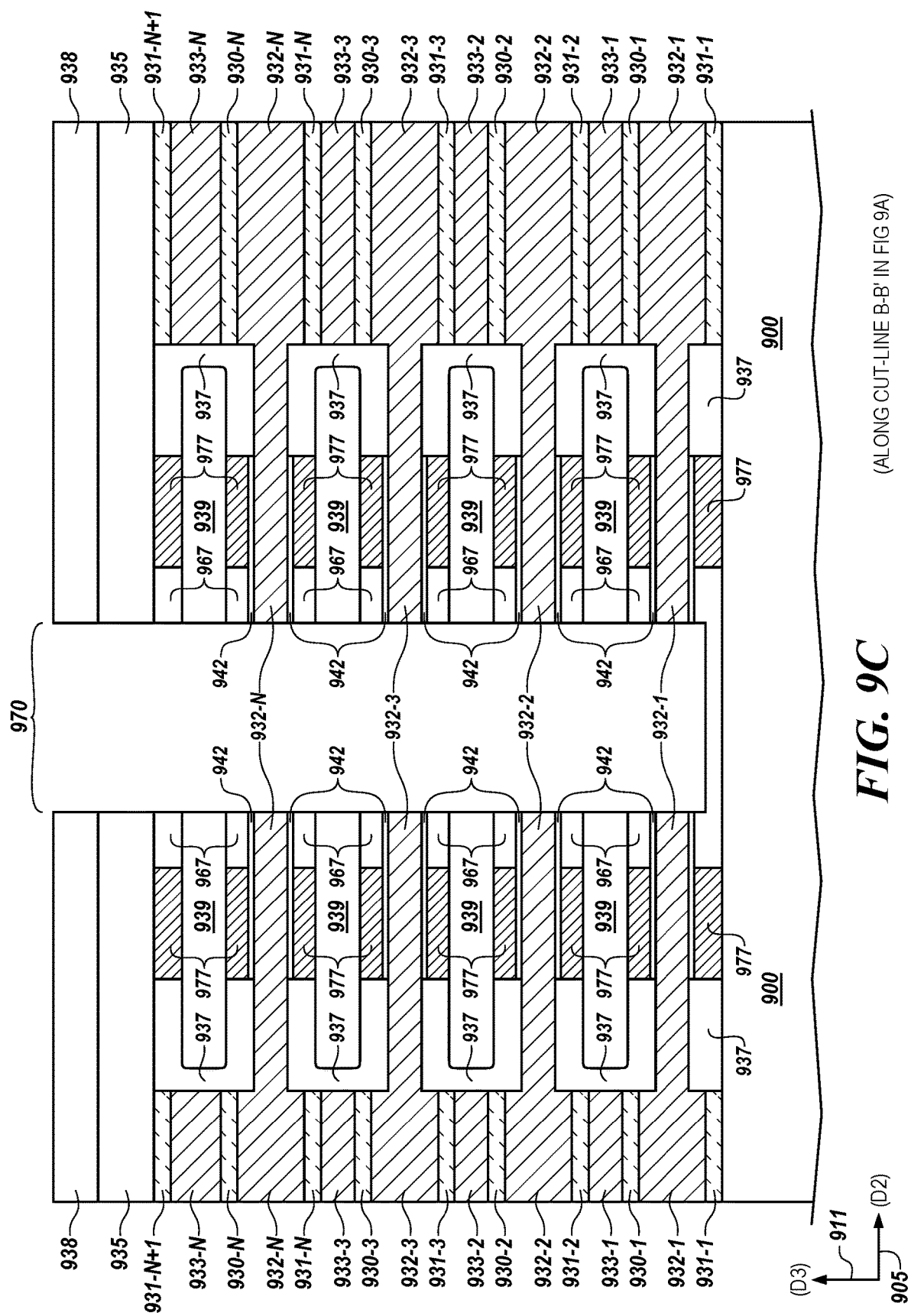
FIG. 9C (ALONG CUT-LINE B-B' IN FIG 9A)

VERTICAL DIGIT LINES WITH ALTERNATING EPITAXIAL SILICON FOR HORIZONTAL ACCESS DEVICES IN 3D MEMORY

TECHNICAL FIELD

The present disclosure relates generally to memory devices, and more particularly, to support structure for vertical digit lines with alternating epitaxial silicon for horizontal access devices in 3D memory.

BACKGROUND

Memory is often implemented in electronic systems, such as computers, cell phones, hand-held devices, etc. There are many different types of memory, including volatile and non-volatile memory. Volatile memory may require power to maintain its data and may include random-access memory (RAM), dynamic random-access memory (DRAM), static random-access memory (SRAM), and synchronous dynamic random-access memory (SDRAM). Non-volatile memory may provide persistent data by retaining stored data when not powered and may include NAND flash memory, NOR flash memory, nitride read only memory (NROM), phase-change memory (e.g., phase-change random access memory), resistive memory (e.g., resistive random-access memory), cross-point memory, ferroelectric random-access memory (FeRAM), or the like.

As design rules shrink, less semiconductor space is available to fabricate memory, including DRAM arrays. A respective memory cell for DRAM may include an access device, e.g., transistor, having a first and a second source/drain regions separated by epitaxially grown channel regions. A gate may oppose the channel region and be separated therefrom by a gate dielectric. An access line, such as a word line, is electrically connected to the gate of the DRAM cell. A DRAM cell can include a storage node, such as a capacitor cell, coupled by the access device to a digit line. The access device can be activated (e.g., to select the cell) by an access line coupled to the access transistor. The capacitor can store a charge corresponding to a data value of a respective cell (e.g., a logic "1" or "0").

BRIEF DESCRIPTION OF THE DRAWINGS

FIGS. 4A to 4B illustrate an example method, at one stage of a semiconductor fabrication process, for forming epitaxial silicon within horizontal access devices in vertical three dimensional (3D) memory, in accordance with a number of embodiments of the present disclosure.

FIGS. 5A to 5E illustrate an example method, at another stage of a semiconductor fabrication process, for forming epitaxial silicon within horizontal access devices in vertical three dimensional (3D) memory, in accordance with a number of embodiments of the present disclosure.

FIGS. 6A to 6D illustrate an example method, at another stage of a semiconductor fabrication process, for forming epitaxial silicon within horizontal access devices in vertical three dimensional (3D) memory, in accordance with a number of embodiments of the present disclosure.

FIG. 7 illustrates an example method, at another stage of a semiconductor fabrication process, for forming epitaxial silicon within horizontal access devices in vertical three dimensional (3D) memory, in accordance with a number of embodiments of the present disclosure.

FIGS. 8A to 8B illustrate an example method, at another stage of a semiconductor fabrication process, for forming epitaxial silicon within horizontal access devices in vertical three dimensional (3D) memory, in accordance with a number of embodiments of the present disclosure.

FIGS. 9A to 9C illustrate an example method, at another stage of a semiconductor fabrication process, for forming epitaxial silicon within horizontal access devices in vertical three dimensional (3D) memory, in accordance with a number of embodiments of the present disclosure.

DETAILED DESCRIPTION

Figure 1A:
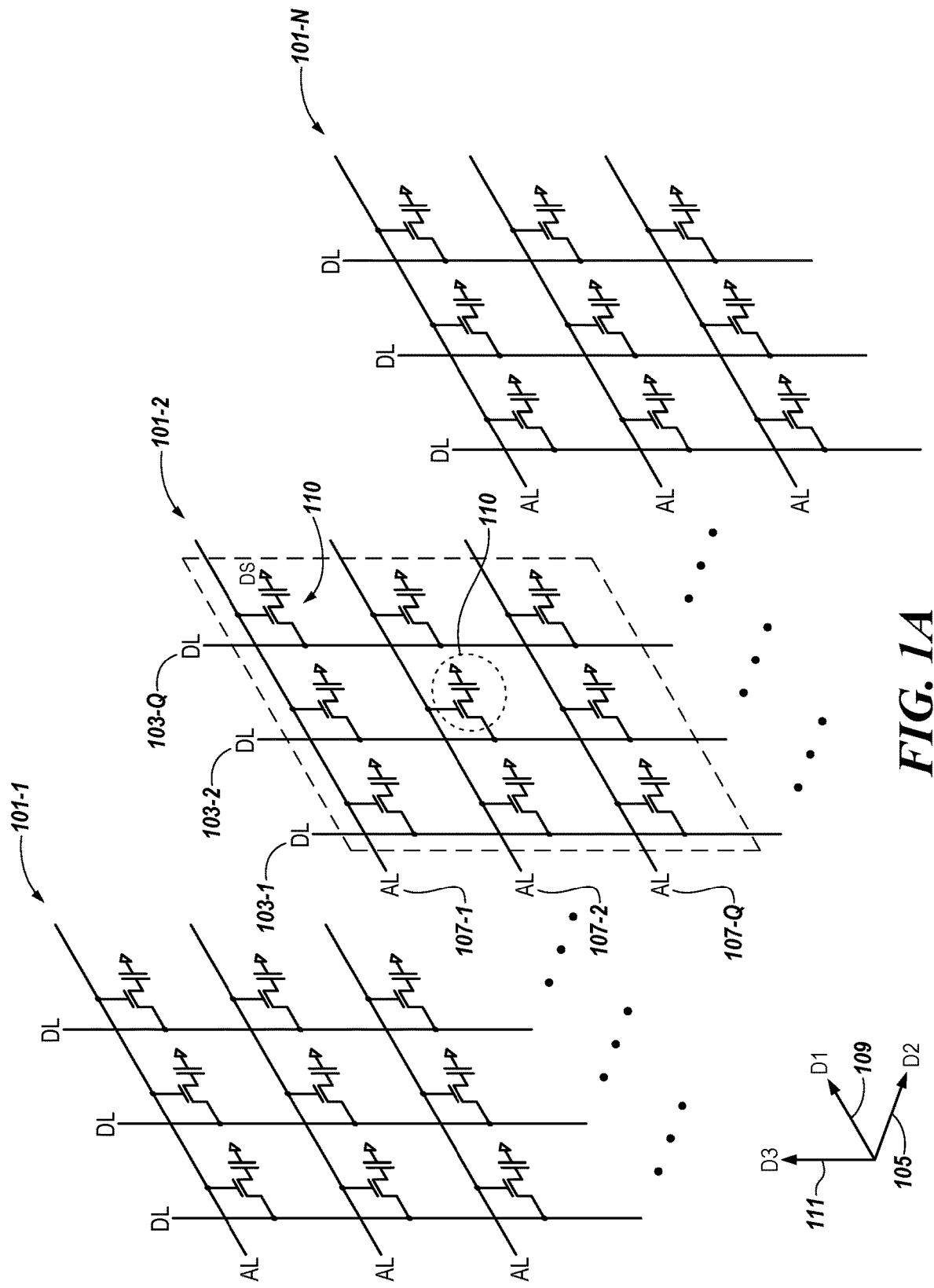
FIG. 1A is a schematic illustration of a horizontal access device in a vertical three dimensional (3D) memory in accordance a number of embodiments of the present disclosure.

Embodiments of the present disclosure describe forming multiple, alternating epitaxially grown silicon germanium (SiGe) and epitaxially grown silicon (Si) to form horizontal access devices in vertical three dimensional (3D) memory. A vertically oriented digit line is formed with horizontally oriented access devices and access lines in an array of vertically stacked memory cells. The horizontal access devices are integrated with horizontally oriented access lines having a first source/drain regions and a second source drain regions separated by epitaxially grown channel regions and integrated with vertically oriented digit lines. In vertically stacked memory array structures, such as transistor structures, polycrystalline silicon (also referred to as polysilicon)

can be leaky, allowing current to leak through the polycrystalline structure, making the transistor less effective. Single crystal silicon is not very leaky, however, single crystal silicon cannot grow on amorphous dielectric materials, such as oxides or nitrides, which are the common materials upon which transistors are formed.

However, as disclosed in the embodiments of the present disclosure, it is possible to use a silicon wafer for a transistor that can be utilized as a substrate during the high temperature processes required for single crystal silicon formation. In such embodiments, a layer of silicon germanium can be grown on the silicon substrate. Single crystal silicon can, then, be grown on the silicon germanium.

This may be accomplished, for example, by providing a thin single crystal silicon germanium layer, as a seed layer, and then heating the layer to grow the single crystal silicon germanium layer thickness through epitaxial growth. Once the desired layer thickness is formed, a silicon layer can be formed into the surface of the silicon germanium layer. As with the silicon germanium layer, this may be accomplished, for example, by providing a thin single crystal silicon layer, as a seed layer, and then heating the layer to grow the thin single crystal silicon layer thickness into a thicker single crystal silicon layer through epitaxial growth.

Depending on the silicon germanium concentration, if silicon is x quantity and germanium is y quantity and, if y is smaller than x, then silicon/silicon germanium has a small lattice mismatch with respect to the lattice of single crystal silicon. This allows silicon to be grown on top of silicon germanium with a single crystal structure. If a thin layer of single crystal silicon is applied to the surface of the silicon germanium, then the whole silicon layer acts as a seed for the growth of the single crystal silicon layer. Such layering can be done in alternating iterations (e.g., SiGe/Si/SiGe/Si, etc.) to create a superlattice structure by selective etch for defect mitigation in the form of a vertical stack such as shown in FIG. 4.

For example, a seed layer of silicon germanium can be formed that is 100 Angstroms in thickness (height) and can be grown to, for example 1000 Angstroms. A thin silicon seed layer can be formed on the surface of the silicon germanium layer that is, for example, 50 Angstroms and can be grown to a thickness of, for example, 300 Angstroms. These thicknesses are merely provided as examples and should not be regarded as limiting unless recited explicitly in a particular claim.

The transistor devices of the present disclosure will have better performance with regard to I-on, better I-off, drivability, and/or leakage current because there is no grain boundary and therefore current cannot leak through the grain boundary which is where leakage often occurs in polysilicon. In some embodiments, devices can have, for example, three orders of magnitude lower I-off (leakage).

Advantages to the structure and process described herein can include a lower off-current (Ioff) for the access devices, as compared to silicon based (Si-based) access devices (e.g., transistors), better DRAM refresh requirement, and/or reduced gate/drain induced leakage (GIDL) for the access devices. The present disclosure describes a channel region formed from a epitaxially grown materials. Combined with a gate all around (GAA) structure at the channel region of the semiconductor material, provides better electrostatic control on the channel, better subthreshold slope and a more cost effective process.

The figures herein follow a numbering convention in which the first digit or digits correspond to the figure number of the drawing and the remaining digits identify an element or component in the drawing. Similar elements or components between different figures may be identified by the use of similar digits. For example, reference numeral 104 may reference element "04" in FIG. 1, and a similar element may be referenced as 204 in FIG. 2. Multiple analogous elements within one figure may be referenced with a reference numeral followed by a hyphen and another numeral or a letter. For example, 302-1 may reference element 302-1 in FIGS. 3 and 302-2 may reference element 302-2, which may be analogous to element 302-1. Such analogous elements may be generally referenced without the hyphen and extra numeral or letter. For example, elements 302-1 and 302-2 or other analogous elements may be generally referenced as 302.

FIG. 1A is a block diagram of an apparatus in accordance with a number of embodiments of the present disclosure. FIG. 1A illustrates a circuit diagram showing a cell array of a three dimensional (3D) semiconductor memory device according to embodiments of the present disclosure. FIG. 1A illustrates that a cell array may have a plurality of sub cell arrays 101-1, 101-2, . . . , 101-N. The sub cell arrays 101-1, 101-2, . . . , 101-N may be arranged along a second direction (D2) 105. Each of the sub cell arrays, e.g., sub cell array 101-2, may include a plurality of access lines 107-1, 107-2, . . . , 107-Q (which also may be referred to a word lines). Also, each of the sub cell arrays, e.g., sub cell array 101-2, may include a plurality of digit lines 103-1, 103-2, . . . , 103-Q (which also may be referred to as bit lines, data lines, or sense lines). In FIG. 1A, the access lines 107-1, 107-2, . . . , 107-Q are illustrated extending in a first direction (D1) 109 and the digit lines 103-1, 103-2, . . . , 103-Q are illustrated extending in a second direction (D3) 111. According to embodiments, the first direction (D1) 109 and the second direction (D2) 105 may be considered in a horizontal ("X-Y") plane. The second direction (D3) 111 may be considered in a vertical ("Z") plane. Hence, according to embodiments described herein, the digit lines 103-1, 103-2, . . . , 103-Q are extending in a vertical direction, e.g., second direction (D3) 111.

A memory cell, e.g., 110, may include an access device, e.g., access transistor, and a storage node located at an intersection of each access line 107-1, 107-2, . . . , 107-Q and each digit line 103-1, 103-2, . . . , 103-Q. Memory cells may be written to, or read from, using the access lines 107-1, 107-2, . . . , 107-Q and digit lines 103-1, 103-2, . . . , 103-Q. The access lines 107-1, 107-2, . . . , 107-Q may conductively interconnect memory cells along horizontal rows of each sub cell array 101-, 101-2, . . . , 101-N, and the digit lines 103-1, 103-2, . . . , 103-Q may conductively interconnect memory cells along vertical columns of each sub cell array 101-, 101-2, . . . , 101-N. One memory cell, e.g. 110, may be located between one access line, e.g., 107-2, and one digit line, e.g., 103-2. Each memory cell may be uniquely addressed through a combination of an access line 107-1, 107-2, . . . 107-Q and a digit line 103-1, 103-2, . . . , 103-Q.

The access lines 107-1, 107-2, . . . , 107-P may be or include conducting patterns (e.g., metal lines) disposed on and spaced apart from a substrate. The access lines 107-1, 107-2, . . . , 107-Q may extend in a first direction (D1) 109. The access lines 107-1, 107-2, . . . , 107-Q in one sub cell array, e.g., 101-2, may be spaced apart from each other in a vertical direction, e.g., in a second direction (D3) 111.

The digit lines 103-1, 103-2, . . . , 103-Q may be or include conductive patterns (e.g., metal lines) extending in a vertical direction with respect to the substrate, e.g., in a second direction (D3) 111. The digit lines in one sub cell array, e.g., 101-2, may be spaced apart from each other in the first direction (D1) 109.

A gate of a memory cell, e.g., memory cell 110, may be connected to an access line, e.g., 107-2, and a first conductive node, e.g., first source/drain region, of an access device, e.g., transistor, of the memory cell 110 may be connected to a digit line, e.g., 103-2. Each of the memory cells, e.g., memory cell 110, may be connected to a storage node, e.g., capacitor. A second conductive node, e.g., second source/drain region, of the access device, e.g., transistor, of the memory cell 110 may be connected to the storage node, e.g., capacitor. While first and second source/drain region references are used herein to denote two separate and distinct source/drain regions, it is not intended that the source/drain region referred to as the "first" and/or "second" source/drain regions have some unique meaning. It is intended only that one of the source/drain regions is connected to a digit line, e.g., 103-2, and the other may be connected to a storage node.

Figure 1B:
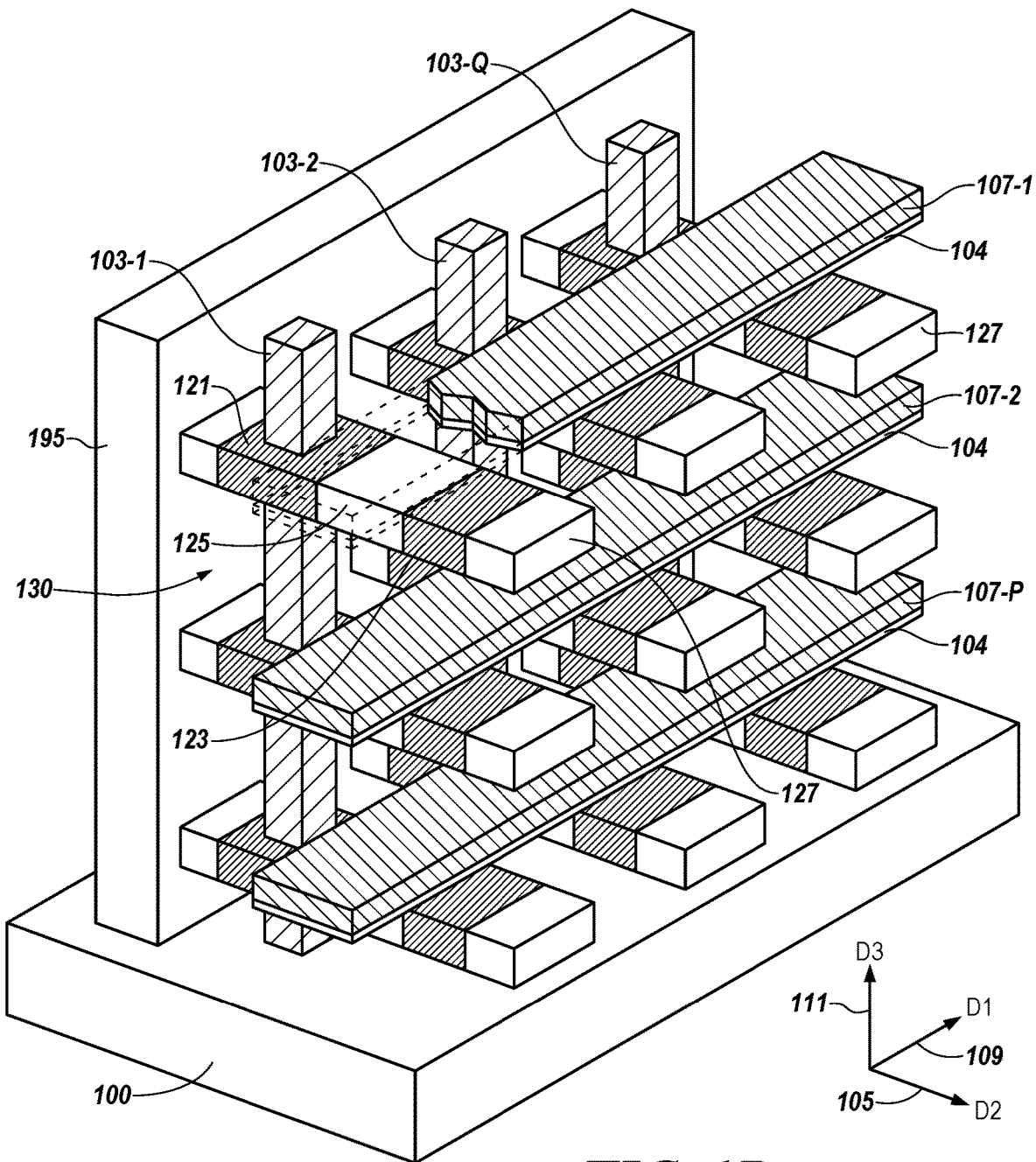
FIG. 1B is a perspective view illustrating a portion of a horizontal access devices in vertical three dimensional (3D) memory in accordance with a number of embodiments of the present disclosure.

FIG. 1B illustrates a perspective view showing a three dimensional (3D) semiconductor memory device, e.g., a portion of a sub cell array 101-2 shown in FIG. 1A as a vertically oriented stack of memory cells in an array, according to some embodiments of the present disclosure.

As shown in FIG. 1B, a substrate 100 may have formed thereon one of the plurality of sub cell arrays, e.g., 101-2, described in connection with FIG. 1A. For example, the substrate 100 may be or include a silicon substrate, a germanium substrate, or a silicon-germanium substrate, etc. Embodiments, however, are not limited to these examples.

As shown in the example embodiment of FIG. 1B, the substrate 100 may have fabricated thereon a vertically oriented stack of memory cells, e.g., memory cell 110 in FIG. 1A, extending in a vertical direction, e.g., second direction (D3) 111. According to some embodiments the vertically oriented stack of memory cells may be fabricated such that each memory cell, e.g., memory cell 110 in FIG. 1A, is formed on plurality of vertical levels, e.g., a first level (L1), a second level (L2), and a second level (L3). The repeating, vertical levels, L1, L2, and L3, may be arranged, e.g., "stacked", a vertical direction, e.g., second direction (D3) 111 shown in FIG. 1A, and may be separated from the substrate 100 by an insulator material 120. Each of the repeating, vertical levels, L1, L2, and L3 may include a plurality of discrete components, e.g., regions, to the horizontally oriented access devices 130, e.g., transistors, and storage nodes, e.g., capacitors, including access line 107-1, 107-2, . . . , 107-Q connections and digit line 103-1, 103-2, . . . , 103-Q connections. The plurality of discrete components to the horizontally oriented access devices 130, e.g., transistors, may be formed in a plurality of iterations of vertically, repeating layers within each level, as described in more detail below in connection with FIGS. 4A-4K, and may extend horizontally in the second direction (D2) 105, analogous to second direction (D2) 105 shown in FIG. 1A.

The plurality of discrete components to the laterally oriented access devices 130, e.g., transistors, may include a first source/drain region 121 and a second source/drain region 123 separated by a channel region 125, extending laterally in the second direction (D2) 105, and formed in a body of the access devices. According to embodiments described herein, and as seen further below, the channel region 125 is formed of epitaxially grown, single crystalline silicon. However, in alternate embodiments, the channel region 125 may include silicon, germanium, silicon-germanium, and/or indium gallium zinc oxide (IGZO). In some embodiments, the first and the second source/drain regions, 121 and 123, can include an n-type dopant region formed in a p-type doped body to the access device to form an n-type conductivity transistor. In some embodiments, the first and the second source/drain regions, 121 and 123, may include a p-type dopant formed within an n-type doped body to the access device to form a p-type conductivity transistor. By way of example, and not by way of limitation, the n-type dopant may include phosphorous (P) atoms and the p-type dopant may include atoms of boron (B) formed in an oppositely doped body region of polysilicon semiconductor material. Embodiments, however, are not limited to these examples.

The storage node 127, e.g., capacitor, may be connected to one respective end of the access device. As shown in FIG. 1B, the storage node 127, e.g., capacitor, may be connected to the second source/drain region 123 of the access device. The storage node may be or include memory elements capable of storing data. Each of the storage nodes may be a memory element using one of a capacitor, a magnetic tunnel junction pattern, and/or a variable resistance body which includes a phase change material, etc. Embodiments, however, are not limited to these examples. In some embodiments, the storage node associated with each access device of a unit cell, e.g., memory cell 110 in FIG. 1A, may similarly extend in the second direction (D2) 105, analogous to second direction (D2) 105 shown in FIG. 1A.

As shown in FIG. 1B a plurality of horizontally oriented access lines 107-1, 107-2, . . . , 107-Q extend in the first direction (D1) 109, analogous to the first direction (D1) 109 in FIG. 1A. The plurality of horizontally oriented access lines 107-1, 107-2, . . . , 107-Q may be analogous to the access lines 107-1, 107-2, . . . , 107-Q shown in FIG. 1A. The plurality of horizontally oriented access lines 107-1, 107-2, . . . , 107-Q may be arranged, e.g., "stacked", along the second direction (D3) 111. The plurality of horizontally oriented access lines 107-1, 107-2, . . . , 107-Q may include a conductive material. For example, the conductive material may include one or more of a doped semiconductor, e.g., doped silicon, doped germanium, etc., a conductive metal nitride, e.g., titanium nitride, tantalum nitride, etc., a metal, e.g., tungsten (W), titanium (Ti), tantalum (Ta), ruthenium (Ru), cobalt (Co), molybdenum (Mo), etc., and/or a metal-semiconductor compound, e.g., tungsten silicide, cobalt silicide, titanium silicide, etc. Embodiments, however, are not limited to these examples.

Among each of the vertical levels, (L1) 113-1, (L2) 113-2, and (L3) 113-P, the horizontally oriented memory cells, e.g., memory cell 110 in FIG. 1A, may be spaced apart from one another horizontally in the first direction (D1) 109. However, the plurality of discrete components to the horizontally oriented access devices 130, e.g., first source/drain region 121 and second source/drain region 123 separated by a channel region 125, extending laterally in the second direction (D2) 105, and the plurality of horizontally oriented access lines 107-1, 107-2, . . . , 107-Q extending laterally in the first direction (D1) 109, may be formed within different vertical layers within each level. For example, the plurality of horizontally oriented access lines 107-1, 107-2, . . . , 107-Q, extending in the first direction (D1) 109, may be formed on a top surface opposing and electrically coupled to the channel regions 125, separated therefrom by a gate dielectric, and orthogonal to horizontally oriented access devices 130, e.g., transistors, extending in laterally in the second direction (D2) 105. In some embodiments, the plurality of horizontally oriented access lines 107-1, 107-2, . . . , 107-Q, extending in the first direction (D1) 109 are formed in a higher vertical layer, farther from the substrate 100, within a level, e.g., within level (L1), than a layer in which the discrete components, e.g., first source/drain region 121 and second source/drain region 123 separated by a channel region 125, of the horizontally oriented access device are formed.

As shown in the example embodiment of FIG. 1B, the digit lines, 103-1, 103-2, . . . , 103-Q, extend in a vertical direction with respect to the substrate 100, e.g., in a second direction (D3) 111. Further, as shown in FIG. 1B, the digit lines, 103-1, 103-2, . . . , 103-Q, in one sub cell array, e.g., sub cell array 101-2 in FIG. 1A, may be spaced apart from each other in the first direction (D1) 109. The digit lines, 103-1, 103-2, . . . , 103-Q, may be provided, extending vertically relative to the substrate 100 in the second direction (D3) 111 in vertical alignment with source/drain regions to serve as first source/drain regions 121 or, as shown, be vertically adjacent first source/drain regions 121 for each of the horizontally oriented access devices 130, e.g., transistors, extending laterally in the second direction (D2) 105, but adjacent to each other on a level, e.g., first level (L1), in the first direction (D1) 109. Each of the digit lines, 103-1, 103-2, . . . , 103-Q, may vertically extend, in the second direction (D3), on sidewalls, adjacent first source/drain regions 121, of respective ones of the plurality of horizontally oriented access devices 130, e.g., transistors, that are vertically stacked. In some embodiments, the plurality of vertically oriented digit lines 103-1, 103-2, . . . , 103-Q, extending in the second direction (D3) 111, may be connected to side surfaces of the first source/drain regions 121 directly and/or through additional contacts including metal silicides.

For example, a first one of the vertically extending digit lines, e.g., 103-1, may be adjacent a sidewall of a first source/drain region 121 to a first one of the horizontally oriented access devices 130, e.g., transistors, in the first level (L1) 113-1, a sidewall of a first source/drain region 121 of a first one of the horizontally oriented access devices 130, e.g., transistors, in the second level (L2) 113-2, and a sidewall of a first source/drain region 121 a first one of the horizontally oriented access devices 130, e.g., transistors, in the second level (L3) 113-P, etc. Similarly, a second one of the vertically extending digit lines, e.g., 103-2, may be adjacent a sidewall to a first source/drain region 121 of a second one of the horizontally oriented access devices 130, e.g., transistors, in the first level (L1) 113-1, spaced apart from the first one of horizontally oriented access devices 130, e.g., transistors, in the first level (L1) 113-1 in the first direction (D1) 109. And the second one of the vertically extending digit lines, e.g., 103-2, may be adjacent a sidewall of a first source/drain region 121 of a second one of the laterally oriented access devices 130, e.g., transistors, in the second level (L2) 113-2, and a sidewall of a first source/drain region 121 of a second one of the horizontally oriented access devices 130, e.g., transistors, in the second level (L3) 113-P, etc. Embodiments are not limited to a particular number of levels.

The vertically extending digit lines, 103-1, 103-2, . . . , 103-Q, may include a conductive material, such as, for example, one of a doped semiconductor material, a conductive metal nitride, metal, and/or a metal-semiconductor compound. The digit lines, 103-1, 103-2, . . . , 103-Q, may correspond to digit lines (DL) described in connection with FIG. 1A.

As shown in the example embodiment of FIG. 1B, a conductive body contact may be formed extending in the first direction (D1) 109 along an end surface of the horizontally oriented access devices 130, e.g., transistors, in each level (L1) 113-1, (L2) 113-2, and (L3) 113-P above the substrate 100. The body contact may be connected to a body (as shown by 336 in FIG. 3) e.g., body region, of the horizontally oriented access devices 130, e.g., transistors, in each memory cell, e.g., memory cell 110 in FIG. 1A. The body contact may include a conductive material such as, for example, one of a doped semiconductor material, a conductive metal nitride, metal, and/or a metal-semiconductor compound.

Although not shown in FIG. 1B, an insulating material may fill other spaces in the vertically stacked array of memory cells. For example, the insulating material may include one or more of a silicon oxide material, a silicon nitride material, and/or a silicon oxynitride material, etc. Embodiments, however, are not limited to these examples.

Figure 2A:
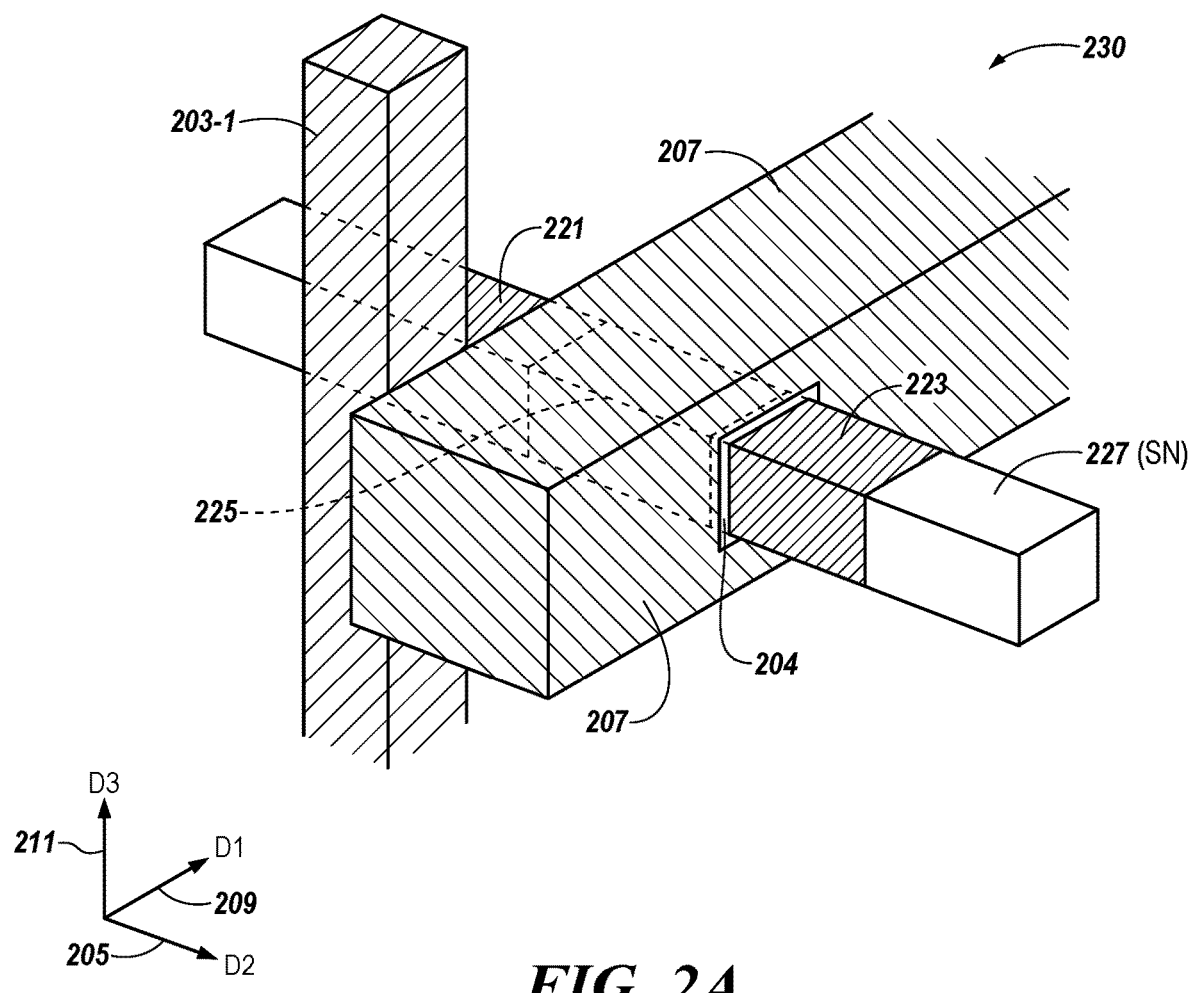
FIGS. 2A-2B illustrate a portion of a horizontal access devices in vertical three dimensional (3D) memory in accordance with a number of embodiments of the present disclosure.

FIG. 2A illustrates in more detail a unit cell, e.g., memory cell 110 in FIG. 1, of the vertically stacked array of memory cells, e.g., within a sub cell array 101-2 in FIG. 1, according to some embodiments of the present disclosure. As shown in FIG. 2A, the first and the second source/drain regions, 221 and 223, may be impurity doped regions to the laterally oriented access devices 230, e.g., transistors. The first and the second source/drain regions, 221 and 223, may be analogous to the first and the second source/drain regions 221 and 223 shown in FIG. 2. The first and the second source/drain regions may be separated by a channel 225 formed in a body of semiconductor material, e.g., body region of the horizontally oriented access devices 230, e.g., transistors. The first and the second source/drain regions, 221 and 223, may be formed from an n-type or p-type dopant doped in the body region. Embodiments are not so limited.

For example, for an n-type conductivity transistor construction the body region of the laterally oriented access devices 230, e.g., transistors, may be formed of a low doped p-type (p-) semiconductor material. In one embodiment, the body region and the channel 225 separating the first and the second source/drain regions, 221 and 223, may include a low doped, p-type (e.g., low dopant concentration (p-)) polysilicon (Si) material consisting of boron (B) atoms as an impurity dopant to the polycrystalline silicon. The first and the second source/drain regions, 221 and 223, may also comprise a metal, and/or metal composite materials containing ruthenium (Ru), molybdenum (Mo), nickel (Ni), titanium (Ti), copper (Cu), a highly doped degenerate semiconductor material, and/or at least one of indium oxide ($In_2O_3$), or indium tin oxide ($In_{2-x}Sn_xO_3$), formed using an atomic layer deposition process, etc. Embodiments, however, are not limited to these examples. As used herein, a degenerate semiconductor material is intended to mean a semiconductor material, such as polysilicon, containing a high level of doping with significant interaction between dopants, e.g., phosphorus (P), boron (B), etc. Non-degenerate semiconductors, by contrast, contain moderate levels of doping, where the dopant atoms are well separated from each other in the semiconductor host lattice with negligible interaction.

In this example, the first and the second source/drain regions, 221 and 221, may include a high dopant concentration, n-type conductivity impurity (e.g., high dopant (n+)) doped in the first and the second source/drain regions, 221 and 223. In some embodiments, the high dopant, n-type conductivity first and second drain regions 221 and 223 may include a high concentration of phosphorus (P) atoms deposited therein. Embodiments, however, are not limited to this example. In other embodiments, the horizontally oriented access devices 230, e.g., transistors, may be of a p-type conductivity construction in which case the impurity, e.g., dopant, conductivity types would be reversed.

As shown in the example embodiment of FIG. 2A, the first source/drain region 221 may occupy an upper portion in the body of the laterally oriented access devices 230, e.g., transistors. For example, the first source/drain region 221 may have a bottom surface within the body of the horizontally oriented access device 230 which is located higher, vertically in the second direction (D3) 211, than a bottom surface of the body of the laterally, horizontally oriented access device 230. As such, the laterally, horizontally oriented transistor 230 may have a body portion which is below the first source/drain region 221 and is in electrical contact with the body contact. Further, as shown in the example embodiment of FIG. 2A, an access line, e.g., 207-1, analogous to the access lines 207-1, 207-2, . . . , 207-Q in FIGS. 2 and 107-1, 107-2, . . . , 107-Q shown in FIG. 1, may disposed on a top surface opposing and coupled to a channel region 225, separated therefrom by a gate dielectric 204. The gate dielectric material 204 may include, for example, a high-k dielectric material, a silicon oxide material, a silicon nitride material, a silicon oxynitride material, etc., or a combination thereof. Embodiments are not so limited. For example, in high-k dielectric material examples the gate dielectric material 204 may include one or more of hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, lead zinc niobite, etc.

As shown in the example embodiment of FIG. 2A, a digit line, e.g., 203-1, analogous to the digit lines 103-1, 103-2, . . . , 103-Q in FIG. 1, may be vertically extending in the second direction (D3) 211 adjacent a sidewall of the first source/drain region 221 in the body to the horizontally oriented access devices 230, e.g., transistors horizontally conducting between the first and the second source/drain regions 221 and 223 along the second direction (D2) 205. In this embodiment, the vertically oriented digit line 203-1 is formed asymmetrically adjacent in electrical contact with the first source/drain regions 221. The digit line 203-1 may be formed as asymmetrically to reserve room for a body contact in the channel region 225.

Figure 2B:
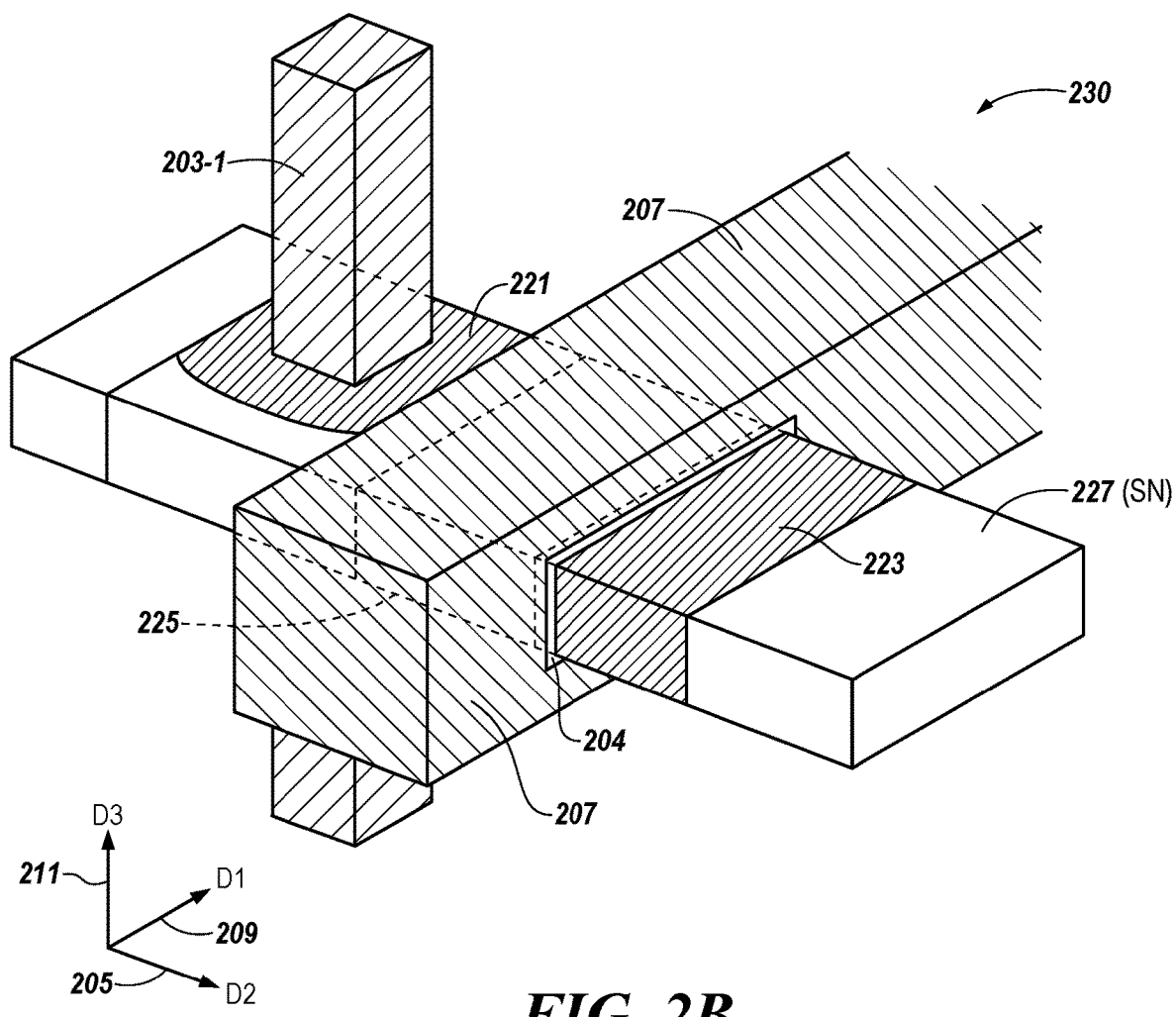

FIG. 2B illustrates in more detail a unit cell, e.g., memory cell 110 in FIG. 1, of the vertically stacked array of memory cells, e.g., within a sub cell array 101-2 in FIG. 1, according to some embodiments of the present disclosure. As shown in FIG. 2B, the first and the second source/drain regions, 221 and 223, may be impurity doped regions to the laterally oriented access devices 230, e.g., transistors. The first and the second source/drain regions, 221 and 223, may be analogous to the first and the second source/drain regions 221 and 223 shown in FIG. 2 and the first and the second source/drain regions 221 and 223 shown in FIG. 2A. The first and the second source/drain regions may be separated by a channel 225 formed in a body of semiconductor material, e.g., body region, of the horizontally oriented access devices 230, e.g., transistors. The first and the second source/drain regions, 221 and 223, may be formed from an n-type or p-type dopant doped in the body region. Embodiments are not so limited.

As shown in the example embodiment of FIG. 2B, a digit line, e.g., 203-1, analogous to the digit lines 103-1, 103-2, . . . , 103-Q in FIG. 1, may be vertically extending in the second direction (D3) 211 adjacent a sidewall of the first source/drain region 221 in the body to the horizontally oriented access devices 230, e.g., transistors horizontally conducting between the first and the second source/drain regions 221 and 223 along the second direction (D2) 205. In this embodiment, the vertically oriented digit line 203-1 is formed symmetrically, in vertical alignment, in electrical contact with the first source/drain region 221. The digit line 203-1 may be formed in contact with an insulator material such that there is no body contact within channel 225.

As shown in the example embodiment of FIG. 2B, the digit line 203-1 may be formed symmetrically within the first source/drain region 221 such that the first source/drain region 221 surrounds the digit line 203-1 all around. The first source/drain region 221 may occupy an upper portion in the body of the laterally oriented access devices 230, e.g., transistors. For example, the first source/drain region 221 may have a bottom surface within the body of the horizontally oriented access device 230 which is located higher, vertically in the second direction (D3) 211, than a bottom surface of the body of the laterally, horizontally oriented access device 230. As such, the laterally, horizontally oriented transistor 230 may have a body portion which is below the first source/drain region 221 and is in contact with the body contact. An insulator material may fill the body contact such that the first source/drain region 221 may not be in electrical contact with channel 225. Further, as shown in the example embodiment of FIG. 2B, an access line, e.g., 207-1, analogous to the access lines 107-1, 107-2, . . . , 107-Q shown in FIG. 1, may disposed all around and coupled to a channel region 225, separated therefrom by a gate dielectric 204.

Figure 3:
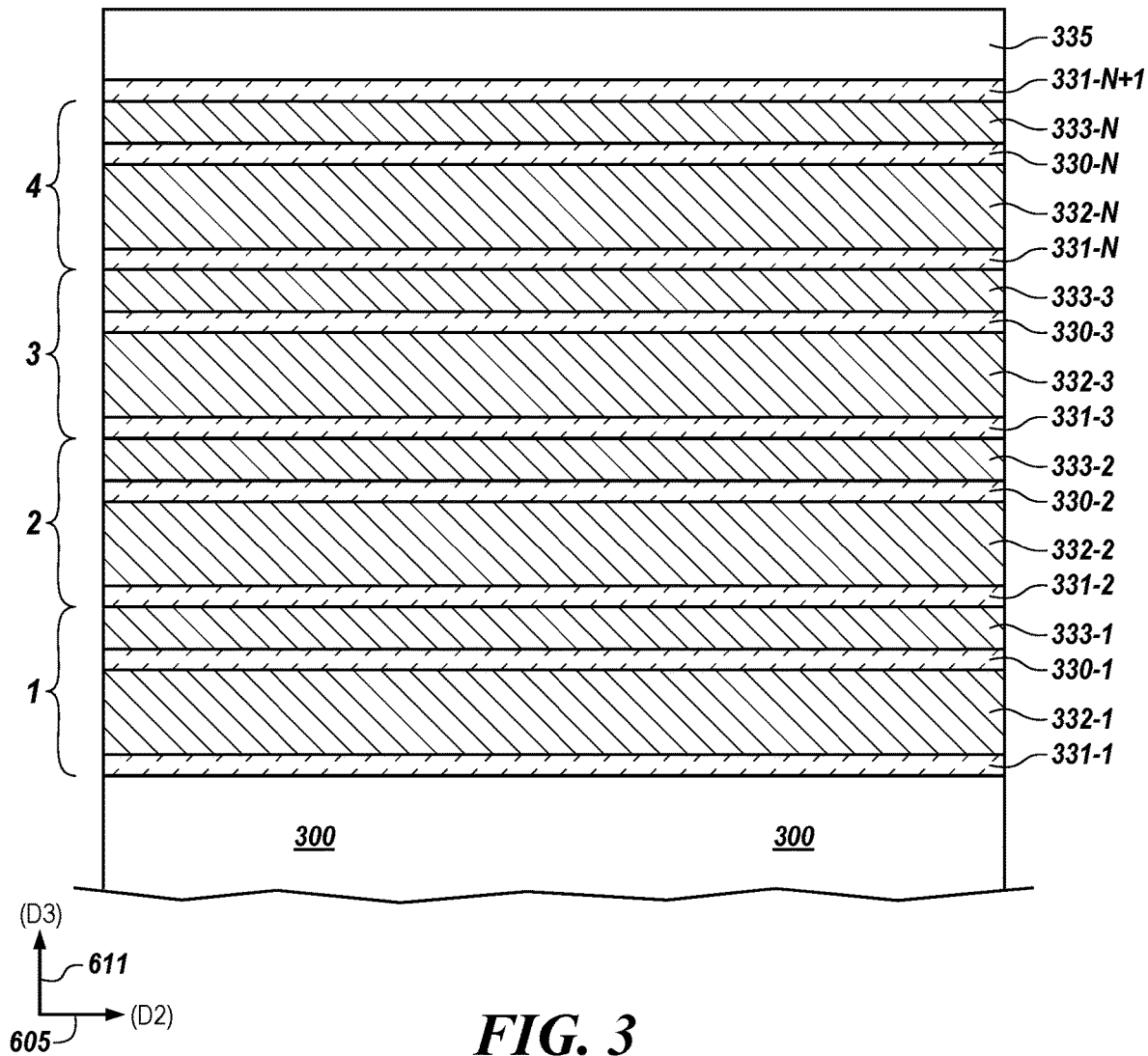
FIG. 3 is a cross-sectional view for forming multiple, alternating epitaxially grown silicon germanium (SiGe) and epitaxially grown, single crystalline silicon (Si), within horizontal access devices in vertical three dimensional (3D) memory for defect mitigation and selective etch in accordance with a number of embodiments of the present disclosure.

FIG. 3 is a cross-sectional view, at one stage of a semiconductor fabrication process, for forming epitaxial silicon within horizontal access devices in vertical three dimensional (3D) memory, such as illustrated in FIGS. 1-2, and in accordance with a number of embodiments of the present disclosure.

In the example embodiment shown in the example of FIG. 3, the method comprises epitaxially forming alternating layers of a silicon germanium (SiGe) material, 331-1, 331-2, . . . , 331-N+1 and 330-1, 330-2, . . . , 330-N (collectively referred to as epitaxially grown silicon germanium (SiGe) 331 and 330), and a silicon (Si) material, 332-1, 332-2, . . . , 332-N and 333-1, 333-2, . . . , 333-N (collectively referred to as epitaxially grown, single crystalline silicon (Si) material 332 and 333), in repeating iterations from a vertical stack 301 on a working surface of a semiconductor substrate 300. In one embodiment, four layers of alternating, varying thickness (t) may be deposited to form a repeating tier to the repeating iterations. For example, the epitaxially grown silicon germanium (SiGe) 330 and 331 can be deposited to have a thickness, e.g., vertical height in the second direction (D3), in a range of five (5) nanometers (nm) to fifteen (15) nm. In one embodiment, the silicon 332 can be deposited to have a thickness (t2), e.g., vertical height, in a range of five (5) nm to sixty (60) nm. Embodiments, however, are not limited to these examples. As shown in FIG. 3, a vertical direction 311 is illustrated as a second direction (D3), e.g., z-direction in an x-y-z coordinate system, analogous to the second direction (D3), among first, second, and second directions, shown in FIGS. 1-2.

In some embodiments, the epitaxially grown silicon germanium (SiGe), 330 and 331, may be an epitaxially grown mix of silicon and germanium. By way of example, and not by way of limitation, the epitaxially grown silicon germanium (SiGe) 330 and 331 may be grown on the substrate material 300. Embodiments are not limited to these examples. The epitaxially grown, single crystalline silicon (Si) material, 332 and 333, may be a low doped, p-type (p-)

epitaxially grown, single crystalline silicon (Si) material. The silicon material, 332 and 333, may also be formed by epitaxially growing on the epitaxially grown silicon germanium (SiGe) 330 and 331 material. After the epitaxially grown silicon germanium (SiGe) 330 and 331 has been formed, the silicon (Si) seed of the epitaxially grown silicon germanium (SiGe) material 330 and 331 may be used to epitaxially grown the single crystalline silicon (Si) material 332 and 333. Embodiments, however, are not limited to these examples.

The repeating iterations of alternating epitaxially grown silicon germanium (SiGe), 330 and 331, layers and epitaxially grown, single crystalline silicon (Si) material, 332 and 333, layers may be deposited according to a semiconductor fabrication process such as chemical vapor deposition (CVD) in a semiconductor fabrication apparatus. Embodiments, however, are not limited to this example and other suitable semiconductor fabrication techniques may be used to deposit the alternating layers of a epitaxially grown silicon germanium (SiGe) and a epitaxially grown, single crystalline silicon (Si) material, in repeating iterations to form the vertical stack 301.

The layers may occur in repeating iterations vertically. In the example of FIG. 3, four tiers, numbered 1, 2, 3, and 4, of the repeating iterations are shown. For example, the stack may include: a first epitaxially grown silicon germanium (SiGe) 331-1, a first epitaxially grown, single crystalline silicon (Si) material 332-1, a second epitaxially grown silicon germanium (SiGe) 330-1, a second epitaxially grown, single crystalline silicon (Si) material 333-1 (tier 1), a third SiGe material 331-2, a third epitaxially grown, single crystalline silicon (Si) material 332-2, a fourth epitaxially grown silicon germanium (SiGe) 330-2, a fourth epitaxially grown, single crystalline silicon (Si) material 333-2 (tier 2), etc., in further repeating iterations. Embodiments, however, are not limited to this example and more or fewer repeating iterations may be included.

Figure 4A:
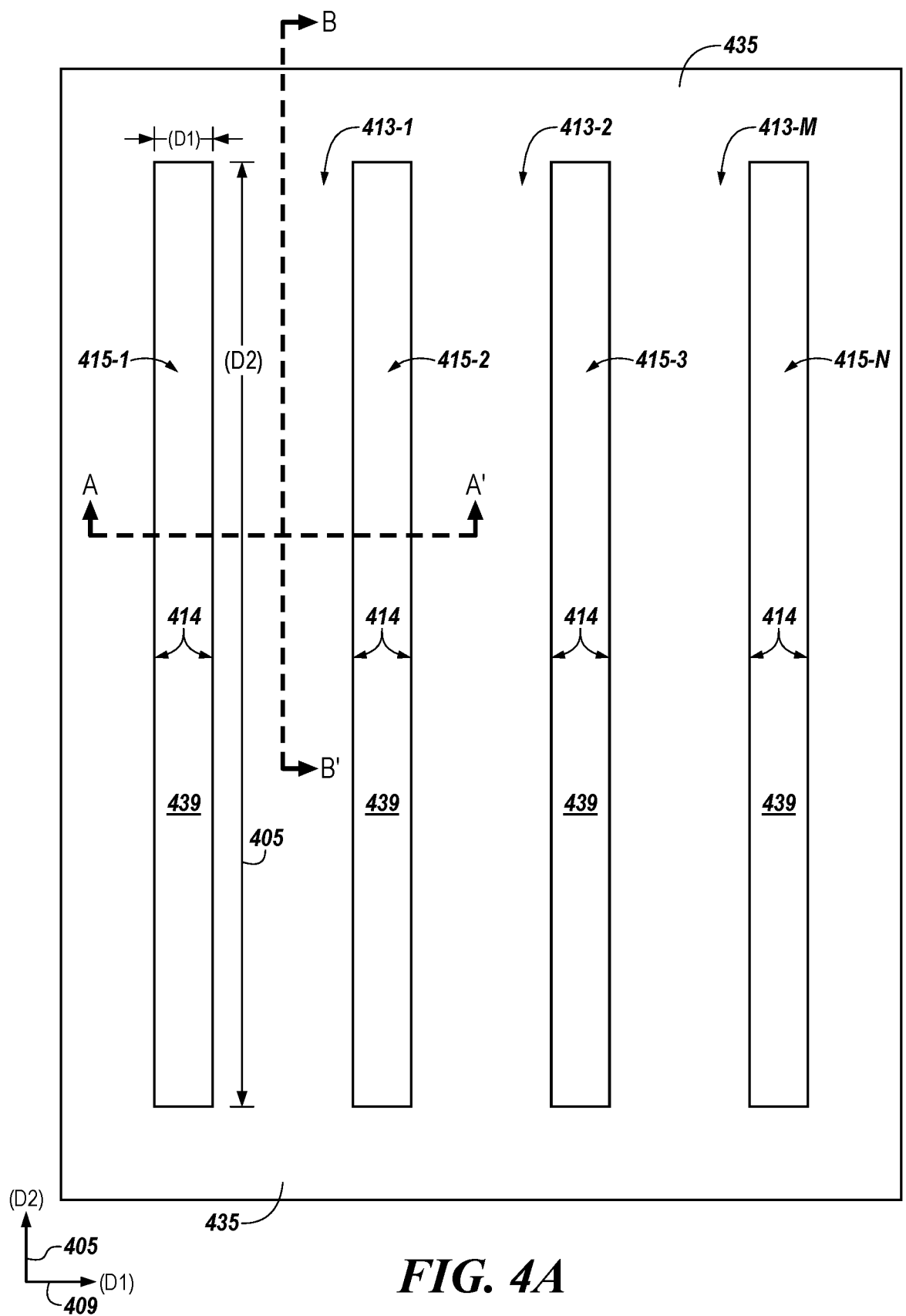

FIG. 4A illustrates an example method, at one stage of a semiconductor fabrication process, for forming epitaxial silicon within horizontal access devices in vertical three dimensional (3D) memory, such as illustrated in FIGS. 1-2, and in accordance with a number of embodiments of the present disclosure. FIG. 4A illustrates a top down view of a semiconductor structure, at a particular point in time, in a semiconductor fabrication process, according to one or more embodiments. In the example embodiment shown in the example of FIG. 4A, the method comprises using an etchant process to form a plurality of first vertical openings 415, having a first horizontal direction (D1) 409 and a second horizontal direction (D2) 405, through the vertical stack to the substrate. In one example, as shown in FIG. 4A, the plurality of first vertical openings 415 are extending predominantly in the second horizontal direction (D2) 405 and may form elongated vertical, pillar columns 413-1, 413-2, . . . , 413-M (collectively and/or independently referred to as 413), with sidewalls 414 in the vertical stack. The plurality of first vertical openings 400 may be formed using photolithographic techniques to pattern a photolithographic mask 435, e.g., to form a hard mask (HM), on the vertical stack prior to etching the plurality of first vertical openings 415. Similar semiconductor process techniques may be used at other points of the semiconductor fabrication process described herein.

The openings 415 may be filled with a dielectric material 439. In one example, a spin on dielectric process may be used to fill the openings 415. In one embodiment, the dielectric material 439 may be an oxide material. However, embodiments are not so limited.

FIG. 4B is a cross sectional view, taken along cut-line A-A' in FIG. 4A, showing another view of the semiconductor structure at a particular time in the semiconductor fabrication process. The cross sectional view shown in FIG. 4B shows the repeating iterations of alternating layers of a epitaxially grown silicon germanium (SiGe) 430 and a epitaxially grown, single crystalline silicon (Si) material 432 on a semiconductor substrate 400 to form the vertical stack, e.g. 401 as shown in FIG. 4.

As shown in FIG. 4B, a plurality of first vertical openings may be formed through the layers within the vertically stacked memory cells to expose vertical sidewalls in the vertical stack and form elongated vertical pillar columns 413 and then filled with a first dielectric material 439. The first vertical openings may be formed through the repeating iterations of the epitaxially grown silicon germanium (SiGe) 430 and 431, and the epitaxially grown, single crystalline silicon (Si) material 432 and 433. As such, the first vertical openings may be formed through a first epitaxially grown silicon germanium (SiGe) 431-1, a first epitaxially grown, single crystalline silicon (Si) material 432-1, a second epitaxially grown silicon germanium (SiGe) 430-1, a second epitaxially grown, single crystalline silicon (Si) material 433-1 (tier 1), a third SiGe material 431-2, a third epitaxially grown, single crystalline silicon (Si) material 432-2 (as part of tier 2), etc. Embodiments, however, are not limited to the vertical opening(s) shown in FIG. 4B. Multiple vertical openings may be formed through the layers of materials. The first vertical openings may be formed to expose vertical sidewalls in the vertical stack. The first vertical openings may extend in a second horizontal direction (D2) 405 to form elongated vertical, pillar columns with first vertical sidewalls in the vertical stack and then filled with second dielectric 439.

As shown in FIG. 4B, a first dielectric material 439, such as an oxide or other suitable spin on dielectric (SOD), may be deposited in the first vertical openings, using a process such as CVD, to fill the first vertical openings. First dielectric material 439 may also be formed from a silicon nitride ($Si_3N_4$) material, a silicon oxy-nitride ($SiO_xN_y$), a silicon boron nitride material (SiBN), a silicon oxide carbide material (SiOC), a silicon carbon nitride material (SiCN), and/or combinations thereof. Embodiments are not limited to these examples. The plurality of first vertical openings may be formed using photolithographic techniques to pattern a photolithographic mask 435, e.g., to form a hard mask (HM), on the vertical stack prior to etching the plurality of first vertical openings. In one embodiment, hard mask 435 may be deposited over a epitaxially grown silicon germanium (SiGe) 430. Similar semiconductor process techniques may be used at other points of the semiconductor fabrication process described herein.

Figure 5A:
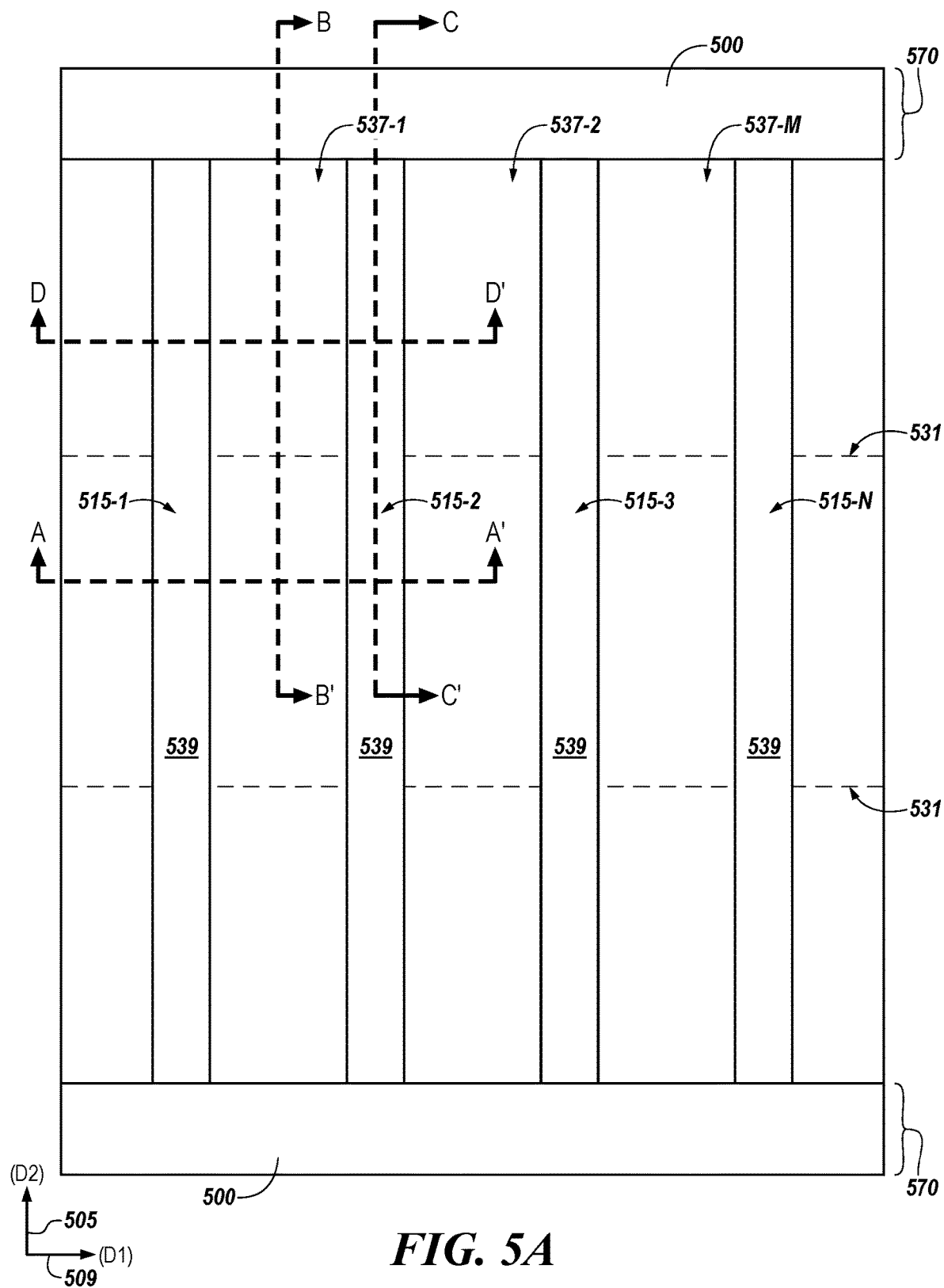

FIG. 5A illustrates an example method, at another stage of a semiconductor fabrication process, for forming epitaxial silicon within horizontal access devices in vertical three dimensional (3D) memory, such as illustrated in FIGS. 1-2, and in accordance with a number of embodiments of the present disclosure. FIG. 5A illustrates a top down view of a semiconductor structure, at a particular point in time, in a semiconductor fabrication process, according to one or more embodiments.

In the example embodiment shown in FIG. 5A, the method comprises using a photolithographic mask to pattern and form a second vertical opening 570 through the vertical stack and extending predominantly in the first horizontal direction to expose sidewalls adjacent a second region of the epitaxially grown silicon germanium (SiGe) and silicon (Si). The second vertical opening 570 may be etched through the hard mask 535 adjacent to where horizontal access devices are to be formed. And, multiple second vertical opening 570 may be formed through the layers of epitaxially grown silicon germanium (SiGe) and silicon (Si) using photolithographic techniques to pattern the hard mask 535 and expose those particular areas of the vertical stack. The second vertical opening 570 may be referred to as a trench through the vertical stack.

FIG. 5B is a cross sectional view, taken along cut-line A-A' in FIG. 5A, showing another view of the semiconductor structure at this particular time in the semiconductor fabrication process. The cross sectional view shown in FIG. 5B shows the repeating iterations of multiple, alternating layers of the epitaxially grown silicon germanium (SiGe) 530 and 531 and the epitaxially grown, single crystalline silicon (Si) material 532 and 533, on a semiconductor substrate 500. In the example embodiment described herein four (4) alternating layers, 531, 532, 530, and 533, are shown making up a tier, e.g., tier 1 in FIG. 3, of the vertical stack. Embodiments, however, are not limited to this example.

As shown in FIG. 5B, a plurality of first vertical openings may have already been formed through the layers within the vertically stacked memory cells to expose first vertical sidewalls in the vertical stack and filled with a first dielectric material 539. The first vertical openings were formed through the repeating iterations of the epitaxially grown silicon germanium (SiGe) 530 and 531 and the epitaxially grown, single crystalline silicon (Si) material 532 and 533.

FIG. 5C is another cross-sectional view, at this particular stage of the semiconductor fabrication process, for forming epitaxial silicon within horizontal access devices in vertical three dimensional (3D) memory, such as illustrated in FIGS. 1-2, and in accordance with a number of embodiments of the present disclosure. FIG. 5C illustrates a cross sectional view, taken along cut-line B-B' in FIG. 5A.

As noted above, FIG. 5C illustrates the method comprises forming second vertical openings 570 through the vertical stack and extending predominantly in the first horizontal direction 509 to expose sidewalls adjacent a second region of the epitaxially grown silicon germanium (SiGe) 530 and 531 and the epitaxially grown, single crystalline silicon (Si) material 532 and 533. Forming the second vertical openings 570 through the vertical stack comprises forming the second vertical openings 570 in vertical alignment with a location to form the horizontal access devices. The second vertical opening 570 may be referred to as a trench through the vertical stack.

As illustrated in FIG. 5C, the cross sectional view shown in FIG. 5C is illustrated extending in the second horizontal direction (D2) 505, left and right along the plane of the drawing sheet, along an axis of the repeating iterations of alternating layers of the epitaxially grown silicon germanium (SiGe) 530 and 531 and the epitaxially grown, single crystalline silicon (Si) material 532 and 533.

In the example embodiment of FIG. 5C the epitaxially grown silicon germanium (SiGe) 530 and 531, and at least one sacrificial layer of the epitaxially grown, single crystalline silicon (Si) material 533, is selectively etched to form a plurality of first horizontal openings 579 extending a first distance (DIST 1) from the second vertical openings 570. For example, an etchant may be flowed into the second vertical openings 570 to selectively etch the epitaxially grown silicon germanium (SiGe) material 530 and 531, and at least one sacrificial layer of the epitaxially grown, single crystalline silicon (Si) material 533, and a portion of the epitaxially grown silicon (Si) material 532. The etchant may selectively remove portions of all iterations of the epitaxially grown silicon germanium (SiGe) 530 and 531, and at least one sacrificial layer of the epitaxially grown, single crystalline silicon (Si) material 533, and a portion of the epitaxially grown silicon (Si) 532 within the stack according to a timed exhume process. As such, the etchant may primarily be selective to the epitaxially grown Si material 532 and selectively remove the epitaxially grown silicon germanium (SiGe) 530 and 531. A second etchant may subsequently be flowed into the second vertical opening 570 to perform a non-selective, isotropic, timed exhume etch of the epitaxially grown, single crystalline Si material 532 and 533 to remove all of the at least one sacrificial layer of the epitaxially grown, single crystalline silicon (Si) material 533, and a portion of the epitaxially grown silicon (Si) 532 a first distance (DIST 1) from the second vertical opening 570 within the stack.

The selective etchant process may occur in multiple steps to protect the structure and stabilize epitaxially grown, single crystalline silicon (Si) material 532. The selective etchant process may consist of one or more etch chemistries selected from an aqueous etch chemistry, a semi-aqueous etch chemistry, a vapor etch chemistry, or a plasma etch chemistries, among other possible selective etch chemistries. For example, a dry etch chemistry of oxygen ($O_2$) or $O_2$ and sulfur dioxide ($SO_2$) may be utilized. As another example, a dry etch chemistry of $O_2$ or of $O_2$ and nitrogen ($N_2$) may be used to selectively etch the epitaxially grown silicon germanium (SiGe) 530 and 531, and at least one sacrificial layer of the epitaxially grown, single crystalline silicon (Si) material 533, and a portion of the epitaxially grown silicon (Si) 532. Alternatively, or in addition, a selective etch to remove the epitaxially grown silicon germanium (SiGe) 530 and 531, and at least one sacrificial layer of the epitaxially grown, single crystalline silicon (Si) material 533, and a portion of the epitaxially grown silicon (Si) 532 may comprise a selective etch chemistry of phosphoric acid ($H_3PO_4$) or hydrogen fluoride (HF) and/or dissolving the epitaxially grown silicon germanium (SiGe) 730 using a selective solvent, among other possible etch chemistries or solvents.

Thus, the selective and non-selective etchant processes may be controlled by controlling time, composition of etchant gas, and etch rate of a reactant gas flowed into the second vertical openings 570, e.g., rate, concentration, temperature, pressure, and time parameters.

The first selective etch may be isotropic, but selective primarily to the epitaxially grown silicon (Si) material 532 and 533, removing only the epitaxially grown silicon germanium (SiGe) 530 and 531. The second non-selective, isotropic etch may be subsequent to the first to remove the at least one sacrificial layer of the epitaxially grown, single crystalline silicon (Si) material 533, and a portion of the epitaxially grown silicon (Si) 532 in the timed exhume process. In one or more embodiments the selective etch may be performed according to a two-step exhumation process to first selectively remove the epitaxially grown silicon germanium (SiGe) 530 and 531 followed by a non-selective removal of the at least one sacrificial layer of the epitaxially grown, single crystalline silicon (Si) material 533, and a portion of the epitaxially grown silicon (Si) 532 to meet device target specifications. Thus, in one example embodiment, the first selective etchant process may remove substantially all of the epitaxially grown silicon germanium (SiGe) 530 and 531 a first distance (DIST 1) from the second vertical opening 570 within the stack. And, the second non-selective etchant process may fully remove the at least one sacrificial layer of the epitaxially grown, single crystalline silicon (Si) material 533, and a portion of the epitaxially grown silicon (Si) 532, etching horizontally a first distance (DIST 1) 576 from the second vertical openings 570 according to the timed exhume process. Embodiments, however, are not limited to this example.

As further shown in FIG. 5C, a controlled oxide lateral punch through the plurality of first vertical openings (415 in FIG. 4A), between the access device regions and the first horizontal openings 579, to form continuous horizontal openings, seen left to right along the plane of the drawing sheet and extending in the first horizontal direction (D1) 509 in FIG. 5E, using a timed exhume process, e.g., selectively etching the first dielectric material 539. In some embodiments, the lateral punch may be a controlled etch process selective to the remaining, thinned epitaxially grown single crystalline silicon (Si) material 532 between separated epitaxially grown, remaining single crystalline silicon (Si) material 532 in the access device regions. In one embodiment, the remaining, thinned epitaxially grown single crystalline Si material 532 has a thickness (t1), from an original thickness (t2), in a range of approximately 50 to 250 angstroms (Å). In one embodiment, the original thickness (t2) is in a range of approximately 300 to 600 angstroms (Å).

FIG. 5D illustrates a cross sectional view, taken along cut-line C-C' in FIG. 5A, showing another view of the semiconductor structure at this particular point in one example semiconductor fabrication process of an embodiment of the present disclosure. The cross sectional view shown in FIG. 5D is illustrated extending in the second horizontal direction (D2) 505, left and right in the plane of the drawing sheet, along an axis of the repeating iterations of multiple, alternating layers of the etched and removed epitaxially grown silicon germanium (SiGe) 530 and 531, and at least one sacrificial layer of the epitaxially grown, single crystalline silicon (Si) material 533, and a portion of the epitaxially grown silicon (Si) 532 forming second horizontal openings 579, and remaining epitaxially grown, single crystalline silicon (Si) material 532 having a thickness (t1) reduced from an original thickness, shown as (t2) in FIG. 5C.

At the left end of the drawing sheet is shown the repeating iterations of alternating layers of the etched epitaxially grown silicon germanium (SiGe) 530 and 531, and at least one sacrificial layer of the epitaxially grown, single crystalline silicon (Si) material 533, and a portion of the epitaxially grown silicon (Si) 532 forming second horizontal openings 579, and the remaining, thinned epitaxially grown, single crystalline silicon (Si) material 532. At the left end of the drawing sheet is shown the repeating iterations of alternating layers of the etched epitaxially grown silicon (SiGe), and etched areas where the first dielectric material has been removed to form continuous horizontal openings 543 in a first direction (D1) 509, separating the layers of remaining, thinned epitaxially grown, single crystalline silicon (Si) material 532. Second vertical opening 570 is shown adjacent a region of the now continuous horizontal openings 543. At the right hand of the drawing sheet, the first dielectric material 539 may be seen, separating access device and storage node regions in the first direction (D1) 509. Dashed lines indicate the presence of the remaining un-etched, un-removed epitaxially grown silicon germanium (SiGe) 530 and 531, and full original deposition thicknesses (t2) of the epitaxially grown, single crystalline silicon (Si) material 532 and 532 and the first dielectric material 539, set into the plane of the drawing sheet, in the cross sectional view, taken along cut-line C-C' in FIG. 5A.

FIG. 5E illustrates a cross sectional view, taken along cut-line D-D' in FIG. 5A, showing another view of the semiconductor structure at this particular point in one example semiconductor fabrication process of an embodiment of the present disclosure. The cross sectional view shown in FIG. 5E is illustrated, right to left in the plane of the drawing sheet, extending in the first direction (D1) 509 along a cross section of the repeating iterations of alternating layers of remaining, thinned epitaxially grown, single crystalline silicon (Si) material 532, extending out of the plane of the drawing sheet from the first dielectric material 539. Arrow 543 illustrates the continuous horizontal openings with the first dielectric material 539 in the background into the plane of the drawing sheet. A hard mask 535 may be covered by second hard mask 537.

Figure 6A:
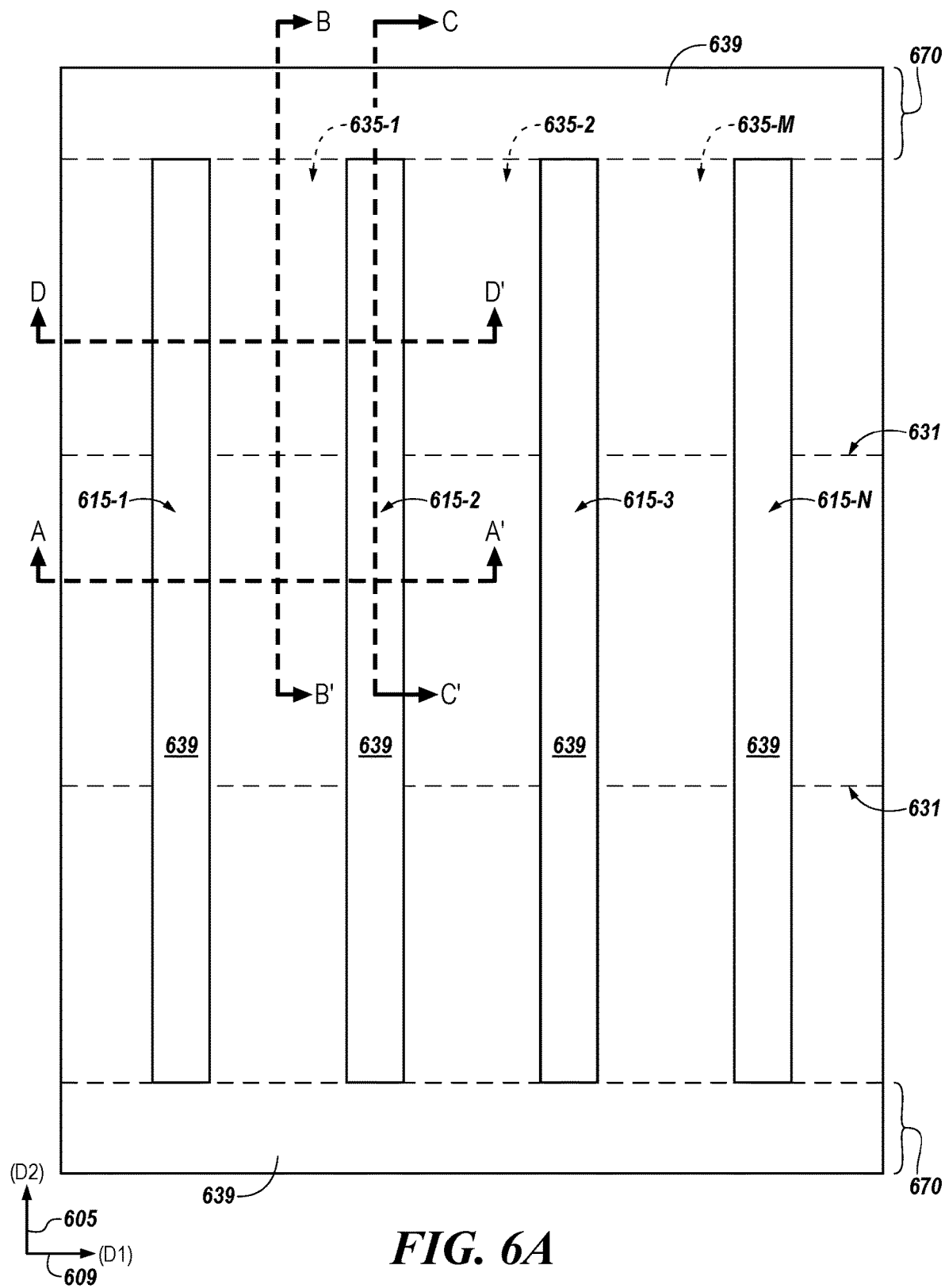

FIG. 6A illustrates an example method, at another stage of a semiconductor fabrication process, for forming epitaxial silicon within horizontal access devices in vertical three dimensional (3D) memory, such as illustrated in FIGS. 1-2, and in accordance with a number of embodiments of the present disclosure. FIG. 6A illustrates a top down view of a semiconductor structure, at a particular point in time, in a semiconductor fabrication process, according to one or more embodiments.

In the example embodiment of FIG. 6A, the method comprises a newly deposited second dielectric material 633 deposited through the second vertical openings (570 in FIG. 5C) on exposed surfaces of the remaining, thinned epitaxially grown, single crystalline silicon (Si) material 632 within the first horizontal openings (579 in FIG. 5C). A portion of the unetched first dielectric material 639 may be seen in FIG. 6B

Figure 6B:
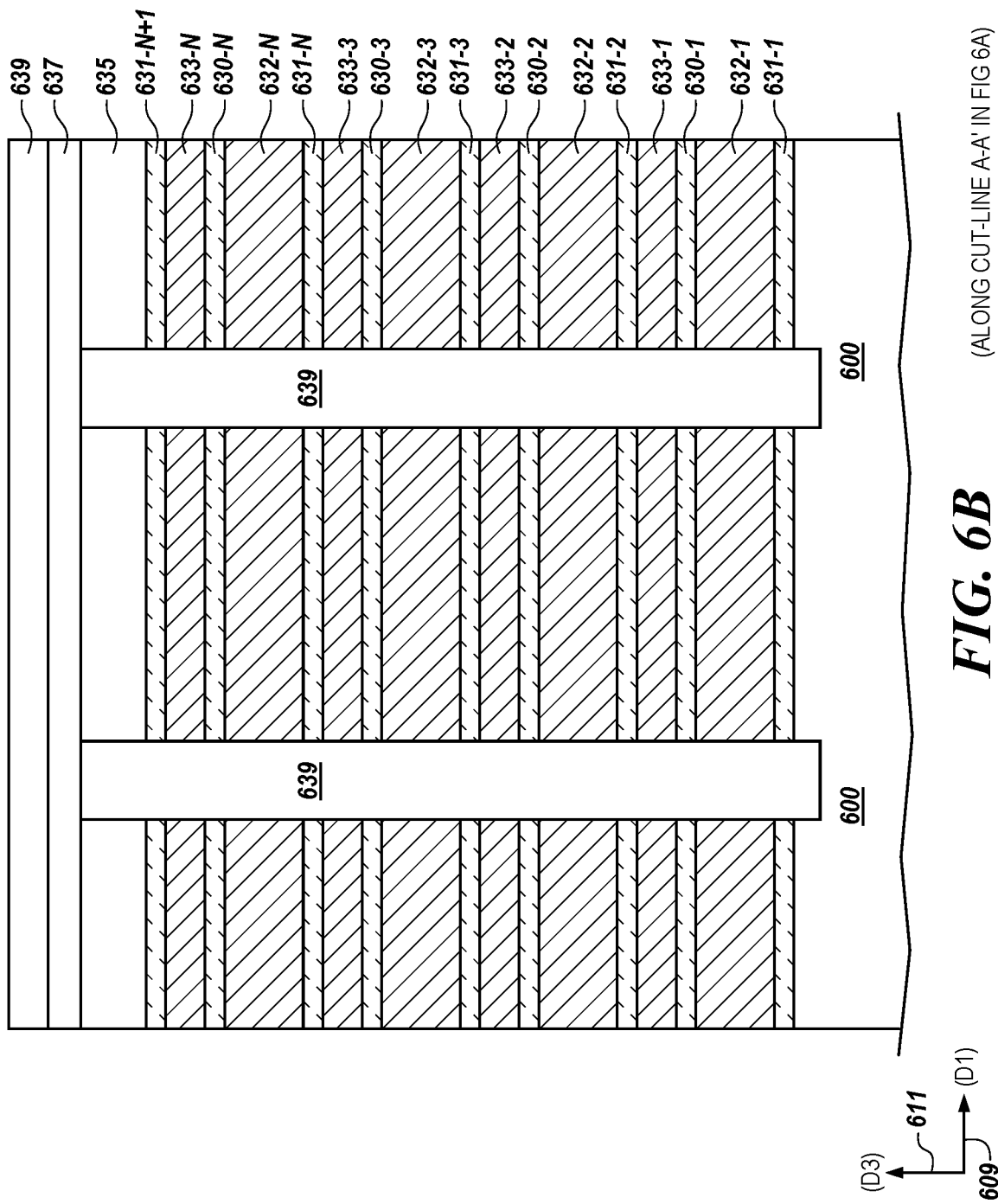

FIG. 6B is a cross sectional view, taken along cut-line A-A' in FIG. 6A, showing another view of the semiconductor structure at a particular time in the semiconductor fabrication process. The cross sectional view shown in FIG. 6B shows the repeating iterations of multiple, alternating layers of epitaxially grown silicon germanium (SiGe) 630 and 631 and the epitaxially grown, single crystalline silicon (Si) material 632 and 633, on a semiconductor substrate 600.

As shown in FIG. 6B, a plurality of first vertical openings have already been formed through the layers within the vertically stacked memory cells to expose first vertical sidewalls (514 in FIG. 5A) in the vertical stack and filled with the first dielectric material 639. In FIGS. 4A-4B, the first vertical openings were formed through the repeating iterations of the epitaxially grown silicon germanium (SiGe) 630 and 631 and the epitaxially grown, single crystalline silicon (Si) material 632 and 633.

As shown in FIG. 6B, a first dielectric material 639, such as an oxide or other suitable spin on dielectric (SOD), is shown in the first vertical openings (515 in FIG. 5A), filling the first vertical openings. A hard mask 635 is shown over the vertical stack having a second dielectric material 637 deposited thereon. In some embodiments, as shown in the cross-sectional view of FIG. 6B, the seconddielectric material 637 may be the same type dielectric material as used for the first dielectric material 639. Embodiments, however, are not so limited.

FIG. 6C is a cross-sectional view, taken along cut-line B-B' in FIG. 6A, showing another view of the semiconductor structure at this particular point in one example semiconductor fabrication process for forming single crystalline epitaxial silicon within horizontal access devices in vertical three dimensional (3D) memory, such as illustrated in FIGS. 1-2, and in accordance with a number of embodiments of the present disclosure.

The epitaxially grown silicon germanium (SiGe) 630 and 631 and sacrificial layer of epitaxially grown silicon (Si) 633 has already been selectively etched isotropically in the second direction (D2) 605, a distance in a timed exhume (DIST 1 in FIG. 6C), to form a plurality of first horizontal openings 679 in the first region separating layers of the remaining, thinned, epitaxially grown single crystalline (Si) material 632. A second dielectric material 637 is conformally deposited on exposed surfaces of the remaining, thinned, epitaxially grown single crystalline (Si) material 632 in the first horizontal openings 679. The second dielectric material 637 may be deposited fully upon exposed surfaces in the plurality of first horizontal openings 679 to provide a first support, bridge-like structure to the remaining, thinned, epitaxially grown single crystalline (Si) material 632. In one embodiment, the second dielectric material is deposited using an atomic layer deposition (ALD) process. The second dielectric material 637 may serve as a liner around the plurality of first horizontal openings 679. The second dielectric material 637 may be flowed into the second vertical opening 670 and first horizontal openings 679, from where sacrificial epitaxially grown silicon germanium (SiGe) material layers 630 and 631 (in FIG. 6C) and at least one, thinner sacrificial epitaxially grown single crystalline (Si) material layer (633 in FIG. 6C) was removed, to cover exposed surfaces of the remaining, thinned, epitaxially grown, single crystalline silicon (Si) material 632 in order to provide support structure to the remaining, thinned, epitaxially grown single crystalline (Si) material 632.

In one embodiment, the second dielectric material 637 may comprise a nitride material. In another embodiment, second dielectric material 637 may comprise a silicon nitride (Si$_3$N$_4$) material (also referred to herein as "SiN"). In another embodiment the second dielectric material 637 may include silicon dioxide (SiO$_2$) material. In another embodiment the second dielectric material 637 may comprise a silicon oxy-carbide (SiOxCy) material, and/or combinations thereof. Embodiments are not limited to these examples.

In one embodiment, the second dielectric material 637 may be conformally deposited all around exposed surfaces in the plurality of first horizontal openings to have a thickness (t3) of approximately 20 to 80 angstroms (Å).

FIG. 6D illustrates a cross sectional view, taken along cut-line D-D' in FIG. 6A, showing another view of the semiconductor structure at this particular point in one example semiconductor fabrication process of an embodiment of the present disclosure. The cross sectional view shown in FIG. 6D is illustrated, right to left in the plane of the drawing sheet, extending in the second direction (D2) 605 along a cross section of the repeating iterations of alternating layers of alternating layers of remaining, thinned, epitaxially grown, single crystalline silicon (Si) material 632, surrounded by second dielectric material 637 and spaced between layers of the vertical stack by the first dielectric material 639. A hard mask 635 may be covered by second dielectric material 637 and the first dielectric material 639. Thus, the first dielectric material 639 may also fill the spaces between the second dielectric materials 637 and the cross section of repeating iterations of alternating layers of remaining, thinned epitaxially grown, single crystalline silicon (Si) material 632.

FIG. 7 illustrates an example method, at another stage of a semiconductor fabrication process, for forming epitaxial silicon within horizontal access devices in vertical three dimensional (3D) memory, such as illustrated in FIGS. 1-2, and in accordance with a number of embodiments of the present disclosure. As will be seen in FIG. 7, a timed selective etch process is performed, selectively etching the second dielectric material 737 a second distance (DIST 2) from the second vertical openings 770.

FIG. 7 illustrates a cross sectional view, taken along cut-line B-B' in FIG. 7A, showing another view of the semiconductor structure at this particular point in one example semiconductor fabrication process of an embodiment of the present disclosure. The cross sectional view shown in FIG. 7 shows the repeating iterations of alternating layers of the epitaxially grown silicon germanium (SiGe) 730 and 731 and the remaining, thinned epitaxially grown, single crystalline silicon (Si) material 732 (and un-etched, un-thinned epitaxially grown, single crystalline silicon (Si) material 732 that was not removed in the timed exhume described in FIG. 5C) on a semiconductor substrate 700.

The cross sectional view shown in FIG. 7 is illustrated extending in the second horizontal direction (D2) 705, left and right along the plane of the drawing sheet, along an axis of the repeating iterations of alternating layers of the epitaxially grown silicon germanium (SiGe) 730 and 731 and the epitaxially grown, single crystalline silicon (Si) material 732 and 733. In the example embodiment of FIG. 7, the second dielectric material 737 is selectively etched a second distance (DIST 2) 783 from the second vertical openings 770. In some examples, the second dielectric material 737 may be etched back a second distance (DIST 2) 783 in a timed selective etch, exhume process. Second distance 783 is the distance from the second vertical openings 770 to a remaining, unetched portion of the second dielectric material 737. In some embodiments, the second dielectric material 737 is etched back from the second vertical openings 770 a second distance (DIST 2) in a range of approximately twenty-five (25) to seventy-five (75) nanometers (nm). The second dielectric material 737 may be selectively etched, being selective to the remaining, thinned epitaxially grown, single crystalline silicon (Si) material 732 and only partially thinning the first dielectric material 739, thus leaving the epitaxially grown, single crystalline silicon (Si) material 732 and portions of the first dielectric material 739 intact. As shown further in FIG. 7, a portion of the first dielectric material 739 has been removed with an additional selective etch of the second dielectric material 737 in the first horizontal openings (679 in FIG. 6C)

Further, as shown in FIG. 7 a gate dielectric material 742 may be formed on exposed surfaces of the remaining, thinned, epitaxially grown, single crystalline silicon (Si) material 732 to form horizontal access devices. In some embodiments the gate dielectric material may be an oxide material 742. The gate dielectric material 742 may be conformally deposited fully around every surface of the remaining, thinned, epitaxially grown, single crystalline silicon (Si) material 732 to form gate all around (GAA) gate structures, at the channel regions of the access devices. The gate dielectric material 742 may be deposited on exposed surfaces of the remaining, thinned, epitaxially grown, single crystalline silicon (Si) material 732 using an atomic layer deposition. In some examples, an oxide material 742 may be deposited over the exposed surfaces of the epitaxially grown, single crystalline silicon (Si) material 732. In some embodiments, the gate dielectric material 742 may be a thermally grown oxide material 742 on exposed surfaces of the remaining, thinned, exposed epitaxially grown, single crystalline silicon (Si) material 732. And, a thermal oxidation process may be used to densify the ALD the oxide material 742. The thermal oxidation process may involve forming oxide material 742 from a hybrid oxide material. The hybrid oxide material may combine a low temperature oxide material and a high temperature oxide material.

As shown in FIG. 7, a first conductive material 777 may be deposited on a gate dielectric material 742 to form gates. The first conductive material 777 may be deposited around the remaining, thinned, exposed epitaxially grown, single crystalline silicon (Si) material 732 such that the first conductive material 777 may have a top portion above the epitaxially grown, single crystalline silicon (Si) material 732 and a bottom portion below the epitaxially grown, single crystalline silicon (Si) material to form gate all around (GAA) gate structures, at the channel regions of the access devices. The gates opposing the channel regions provide a subthreshold voltage (sub-Vt) slope in a range of approximately 45 to 100 millivolts per decade (mV/dec). The first conductive material 777 may be conformally deposited into second vertical openings 770 and fill the continuous horizontal openings 743 up to the unetched portions of the first dielectric material 739 and the second dielectric material 737. The first conductive material 777 may be conformally deposited using a chemical vapor deposition (CVD) process, plasma enhanced CVD (PECVD), atomic layer deposition (ALD), or other suitable deposition process.

In some embodiments, the first conductive material, 777, may comprise one or more of a doped semiconductor material, e.g., doped silicon, doped germanium, etc. In some embodiments, the first conductive material 777 may comprise a conductive metal nitride material, e.g., titanium nitride, tantalum nitride, etc. In some embodiments, the first conductive material may comprise a metal, e.g., tungsten (W), titanium (Ti), tantalum (Ta), ruthenium (Ru), cobalt (Co), molybdenum (Mo), etc., and/or a metal-semiconductor compound, e.g., tungsten silicide, cobalt silicide, titanium silicide, etc, and/or some other combination thereof. The first conductive material 777 together with the gate dielectric material 742 may form horizontally oriented access lines (which also may be referred to a wordlines) opposing channel regions of the epitaxially grown, single crystalline silicon (Si) material.

Figure 8A:
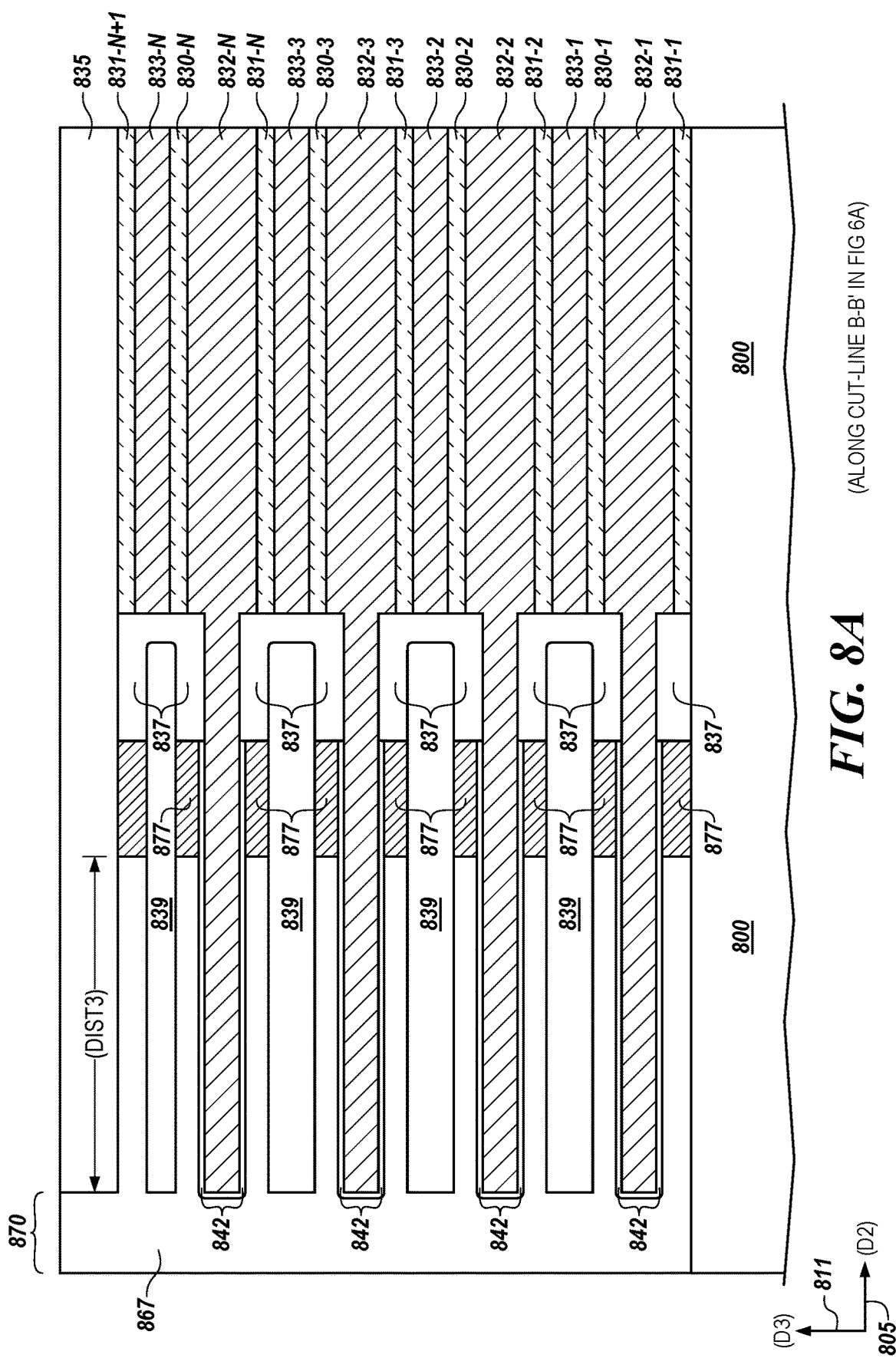

FIG. 8A illustrates a cross sectional view, taken along cut-line B-B' in FIG. 6A, showing another view of the semiconductor structure at another particular point in one example semiconductor fabrication process of an embodiment of the present disclosure. The cross sectional view shown in FIG. 8A is illustrated extending in the second horizontal direction (D2) 805, left and right along the plane of the drawing sheet, along an axis of the repeating iterations of alternating layers of the epitaxially grown silicon germanium (SiGe) 830 and 831 and the epitaxially grown, single crystalline silicon (Si) material 832 and 833.

A first conductive material 877 was deposited on the gate dielectric material 842 and formed around the remaining, thinned, epitaxially grown, single crystalline silicon (Si) material 832, and is here recessed back to form gate all around (GAA) structures opposing only channel regions of the epitaxially grown, single crystalline silicon (Si) material 832. The first conductive material 877, formed on the gate dielectric material 842, may be recessed and etched away from the second vertical opening 870. In some embodiments, the first conductive material 877 may be etched using an atomic layer etching (ALE) process. In some embodiments, the first conductive material 877 may be etched using an isotropic etch process. The first conductive material 877 may be selectively etched leaving the gate dielectric material 842 covering the remaining, thinned epitaxially grown, single crystalline silicon (Si) material 832 and the first dielectric material 839 intact. The first conductive material 877 may be selectively etched in the second direction, in the continuous second horizontal openings (described above), a second distance (DIST 3) in a range of twenty (20) to fifty (50) nanometers (nm) back from the second vertical opening 870. The first conductive material 877 may be selectively etched around the remaining, thinned epitaxially grown, single crystalline silicon (Si) material 832 and back into the continuous horizontal openings (described above) extending in the first horizontal direction 809. A dielectric material 867 (similar to the second dielectric material illustrated as second dielectric material 737 in FIG. 7) may be deposited into second vertical openings 870 and filling the continuous second horizontal openings up to the unetched portions of the gate dielectric material 842, the un-etched first dielectric material 839, and the first conductive material 877. In one embodiment, the second dielectric material 867 may comprise a nitride material. In another embodiment, second dielectric material 867 may comprise a silicon nitride ($Si_3N_4$) material (also referred to herein as "SiN"). In another embodiment the second dielectric material 867 may include silicon dioxide ($SiO_2$) material. In another embodiment the second dielectric material 867 may comprise a silicon oxy-carbide (SiOxCy) material, and/or combinations thereof. Embodiments are not limited to these examples.

The second dielectric material 867 may be deposited in the second vertical opening 870 to gap fill the first horizontal openings adjacent the first conductive material 877. The second dielectric material 867 may be conformally deposited using a chemical vapor deposition (CVD) process, plasma enhanced CVD (PECVD), atomic layer deposition (ALD), or other suitable deposition process. The second dielectric material 867 may be a nitride material. The second dielectric material 867 may be a silicon nitride (SiN) material.

FIG. 8B illustrates a cross sectional view, taken along cut-line D-D' in FIG. 6A, showing another view of the semiconductor structure at this particular point in one example semiconductor fabrication process of an embodiment of the present disclosure. The cross sectional view shown in FIG. 8B is illustrated extending in the first horizontal direction (D1) 809, left and right in the plane of the drawing sheet, along an axis perpendicular to the repeating iterations of multiple, alternating layers of the etched first conductive material 877, gate dielectric 842, and epitaxially grown, single crystalline silicon (Si) material 832.

In FIG. 8B, first dielectric material 839 is shown spacing the arrays of vertically stacked memory cells, extending left and right along a first horizontal direction (D1) 809 in the plane of the drawings sheet, for a three dimensional array of vertically oriented memory cells. Extending into and out from the plane of the drawing sheet is shown the repeating iterations of alternating layers of the remaining, thinned epitaxially grown, single crystalline silicon (Si) material 832 at the channel regions covered by the gate dielectric material 842, and covered in the continuous second horizontal openings (described above) in the first direction (D1) 809 by the first conductive material 877. The first conductive material 877, formed on the gate dielectric material 842, was etched away from the second vertical opening 870. The first conductive material 877, formed on the gate dielectric material 842, was recessed back in the continuous horizontal openings extending in the second horizontal direction 805.

The first conductive material 877 is deposited on the gate dielectric material 842 and formed around the epitaxially grown, single crystalline silicon (Si) material 832 to form gate all around (GAA) structure opposing channel regions of the epitaxially grown, single crystalline silicon (Si) material 32 in the access device regions. In FIG. 8B, the first conductive material, 877 is shown filling in the space in the second horizontal openings (described above) left by the etched first dielectric material 839.

Figure 9A:
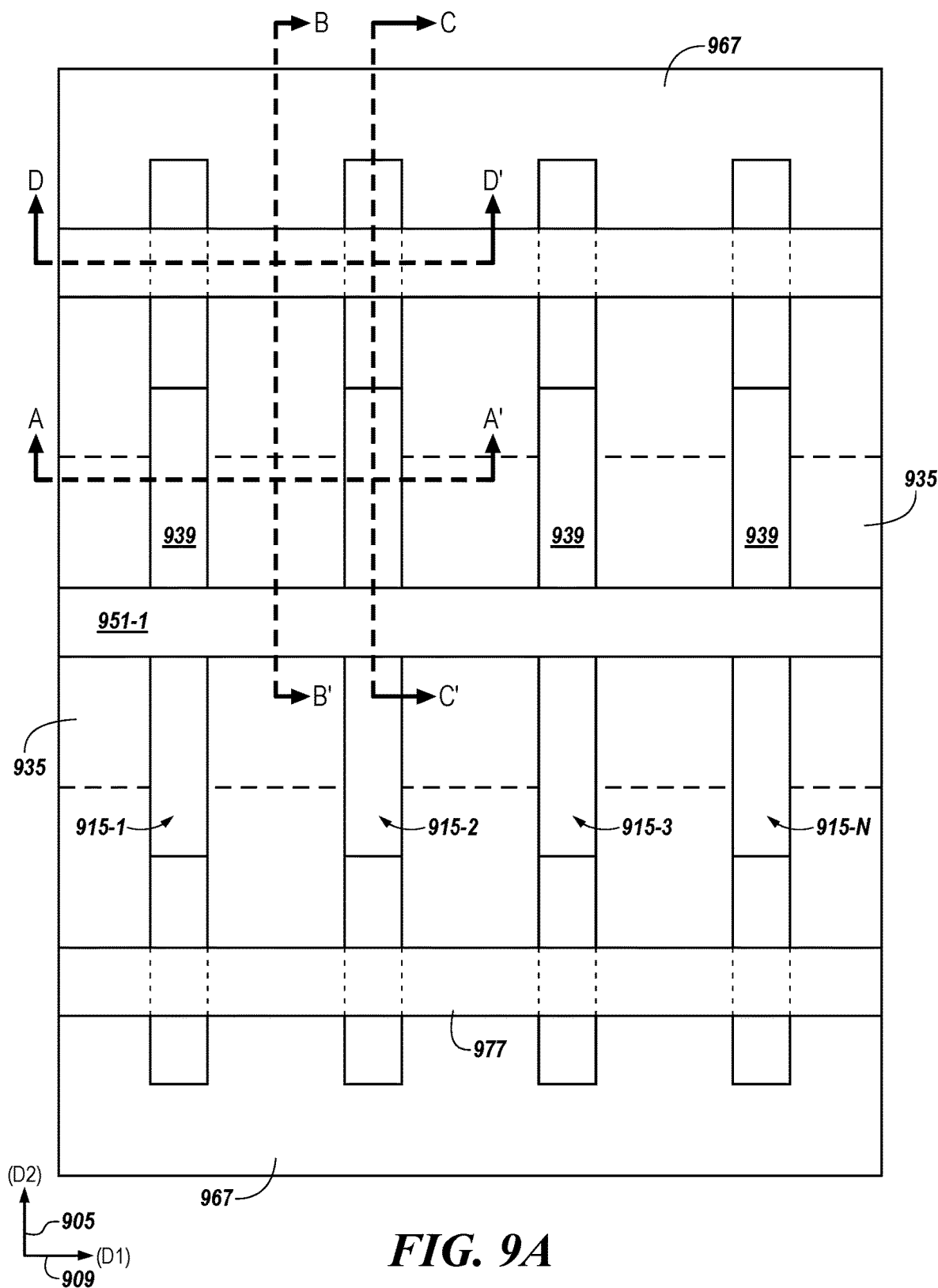

FIG. 9A illustrates an example method, at another stage of a semiconductor fabrication process, for forming epitaxial silicon within horizontal access devices in vertical three dimensional (3D) memory, such as illustrated in FIGS. 1-2, and in accordance with a number of embodiments of the present disclosure. FIG. 9A illustrates a top down view of a semiconductor structure, at a particular point in time, in a semiconductor fabrication process, according to one or more embodiments. In the example embodiment of FIG. 9A, the method comprises using a photolithographic process to pattern the photolithographic mask 938 to form third vertical opening 951 adjacent a second region of the repeating iterations of alternating layers of the epitaxially grown silicon germanium (SiGe) 930 and 931 and the epitaxially grown, single crystalline silicon (Si) material 932 and 933 to expose second vertical sidewalls in the stack (e.g., stack shown in FIG. 4). In FIGS. 9A-9C the epitaxially grown, single crystalline silicon (Si) material 932 and 933 is selectively etched in the second horizontal direction to form a plurality of second horizontal openings 979 (shown in FIG. 9C), in which to form storage nodes, in the second region, e.g., storage node regions in the 3D vertical array of memory cells. Once the epitaxially grown, single crystalline silicon (Si) material 932 and 933 has been removed by selectively etching, second source/drain regions 945, adjacent channel regions for the horizontal access devices, may be formed in a side surface of the epitaxially grown, single crystalline silicon (Si) material 932 through gas phase doping from the second horizontal openings 979.

FIG. 9B illustrates a cross sectional view, taken along cut-line A-A' in FIG. 9A in the storage node regions, showing another view of the semiconductor structure at this particular point in one example semiconductor fabrication process of an embodiment of the present disclosure. The cross sectional view shown in FIG. 9B is away from the plurality of separate, horizontal access lines, 977 and shows bridged, repeating iterations of multiple, alternating layers of epitaxially grown silicon germanium (SiGe) 930 and 931 on a semiconductor substrate 900 bridging openings of the second horizontal openings 979 to form the vertical stack where the epitaxial silicon material 932 and 933 has been removed to form storage nodes. As shown in FIG. 9B, a vertical direction 911 is illustrated as a third direction (D3), e.g., z-direction in an x-y-z coordinate system, analogous to the third direction (D3) 911, among first, second, and second directions, shown in FIGS. 1-2. The plane of the drawing sheet, extending right and left, is in a first direction (D1) 909. In the example embodiment of FIG. 9B, the materials within the vertical stack, e.g., multiple, alternating layers of epitaxially grown silicon germanium (SiGe) 930 and 931 are extending into and out of the plane of the drawing sheet in second direction (D2) and along an axis of orientation of the horizontal access devices and horizontal storage nodes of the arrays of vertically stacked memory cells of the three dimensional (3D) memory.

FIG. 9C illustrates a cross sectional view, taken along cut-line B-B' in FIG. 9A, showing another view of the semiconductor structure at this particular point in one example semiconductor fabrication process of an embodiment of the present disclosure. The cross sectional view shown in FIG. 9C is illustrated extending in the second horizontal direction (D2) 905, left and right along the plane of the drawing sheet, along an axis of the repeating iterations of alternating layers of epitaxially grown silicon germanium (SiGe) 930, along and in which the horizontally oriented access devices and horizontally oriented storage nodes, e.g., capacitor cells, can be formed within the layers of epitaxially grown, single crystalline silicon (Si) material 932.

In the example embodiment of FIG. 9, the second dielectric material 967 is selectively etched from the second vertical openings 970. In some examples, the second dielectric material 967 may be etched in a timed selective etch, exhume process. The second dielectric material 967 may be selectively etched to expose edges of the epitaxially grown, single crystalline Si layers 932 in the second vertical opening 970.

As is shown in FIG. 9C, a source/drain region 945 may be formed by gas phase doping a dopant into a side surface portion of the epitaxially grown, single crystalline silicon (Si) material 932. In some embodiments, the source/drain region 945 may be a second source/drain region 945 adjacent storage node regions and on one side of channel regions on an opposite side of channel regions from a first source/drain region (1243 in FIG. 12C) connecting to a digit line connection (described in FIGS. 12-14) to the horizontal access devices. In one example, gas phase doping may be used to achieve a highly isotropic e.g., non-directional doping, to form the second source/drain regions 945 for the horizontally oriented access devices. In another example, thermal annealing with doping gas, such as phosphorous (P) may be used with a high energy plasma assist to break the bonding. Embodiments, however, are not so limited and other suitable semiconductor fabrication techniques may be utilized.

Figure 10:
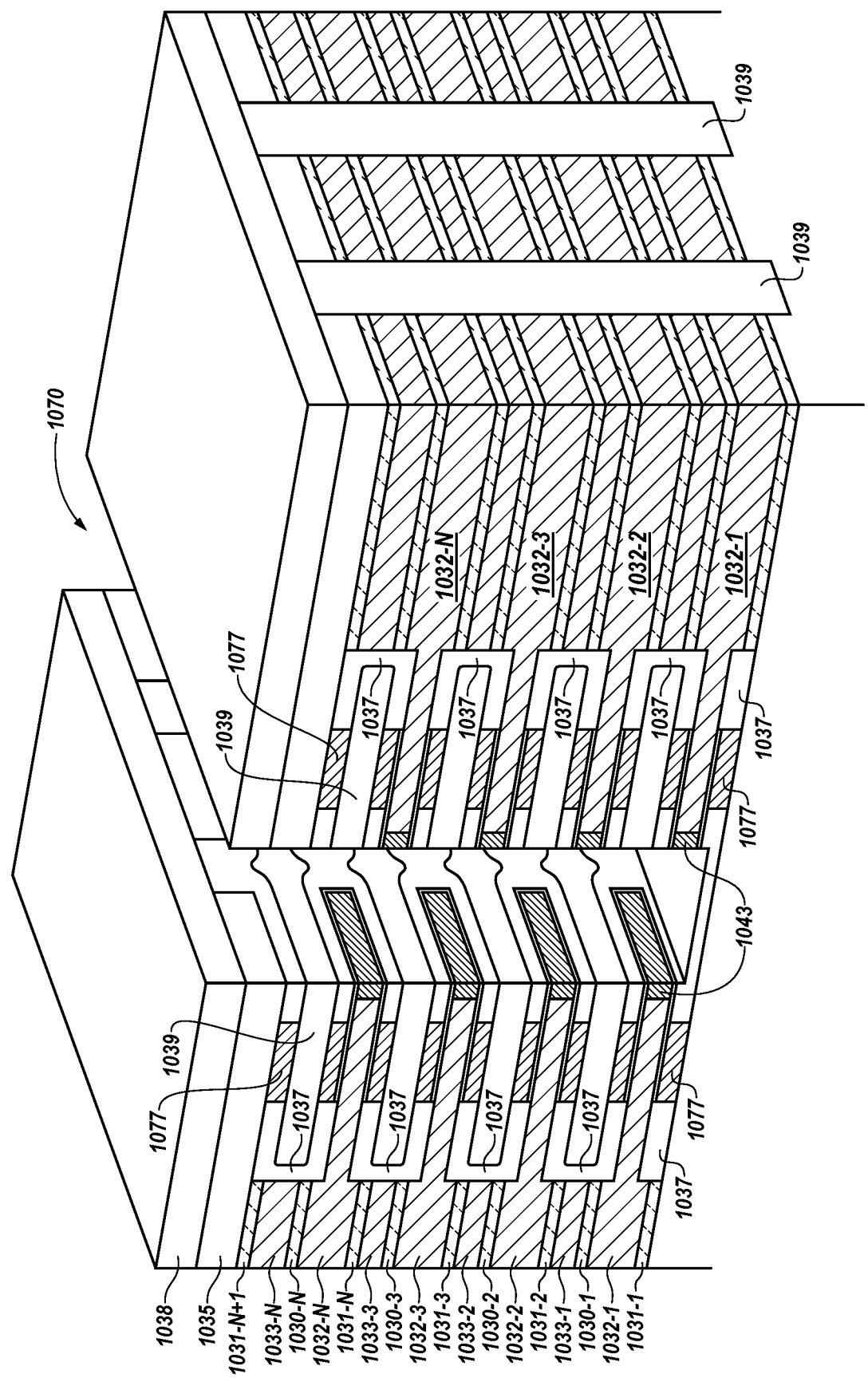
FIGS. 10 to 13 illustrate a 3D cross sectional view, showing another view of the semiconductor structure at this particular point in one example semiconductor fabrication process of an embodiment of the present disclosure.

FIG. 10 illustrates a 3D cross sectional view, showing another view of the semiconductor structure at this particular point in one example semiconductor fabrication process of an embodiment of the present disclosure. The cross sectional view shown in FIG. 1010 is illustrated extending in the second horizontal direction (D2) 1005, left and right along the plane of the drawing sheet, along an axis of the repeating iterations of alternating layers of support structure oxide material 1039 and epitaxially grown, single crystalline silicon (Si) material 1032 along and in which the horizontally oriented access devices are formed.

As is shown in FIG. 10, a first source/drain region 1043 may be formed by gas phase doping a dopant into a side surface portion of the epitaxially grown, single crystalline silicon (Si) material 1032. In some embodiments, the first source/drain region 1043 may be a first source/drain region. In one example, gas phase doping may be used to achieve a highly isotropic e.g., non-directional doping, to form the source/drain regions 1043 for the horizontally oriented access devices. In another example, thermal annealing with doping gas, such as phosphorous (P) may be used with a high energy plasma assist to break the bonding. Embodiments, however, are not so limited and other suitable semiconductor fabrication techniques may be utilized.

Figure 11:
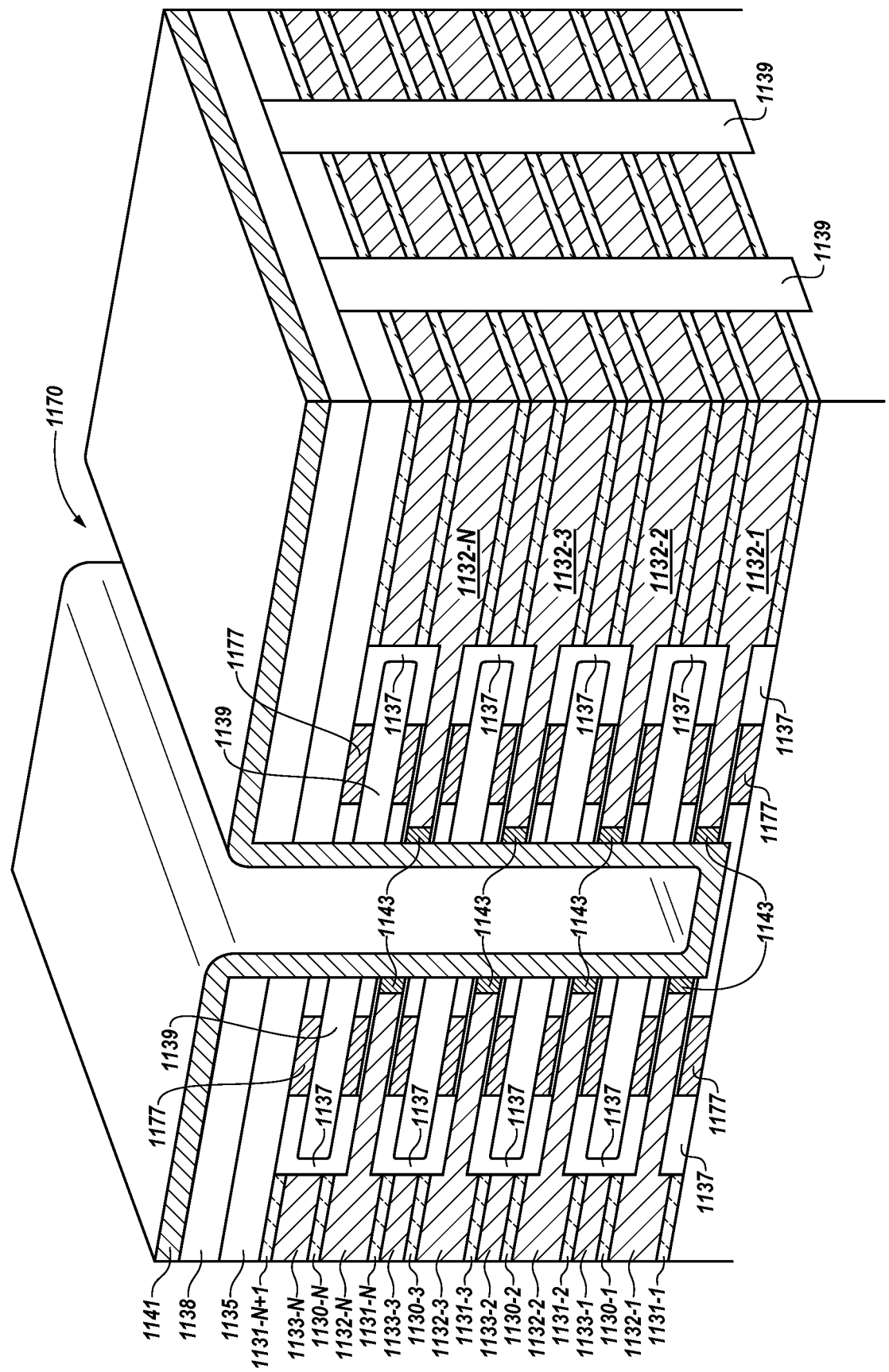

FIG. 11 illustrates a 3D cross sectional view showing another view of the semiconductor structure at this particular point in one example semiconductor fabrication process of an embodiment of the present disclosure.

A second conductive material 1141 may be deposited to form vertical digit lines. The second conductive material 1141 may be formed as a vertical digit line adjacent multiple, alternating layers of remaining, thinned epitaxially grown, single crystalline silicon (Si) material 1132. In particular, the second conductive material 1141 may form vertically oriented digit lines in the second vertical opening 1170 through the vertical stack in electrical contact with first source/drain regions 1143 to form vertically oriented digit lines.

In one embodiment, the second conductive material 1141 may form a continuous, second conductive material 1141 in the second vertical opening 1170 along a bottom surface of the second vertical opening to form shared digit lines between horizontal access devices, in two separate arrays, on opposing second vertical surfaces of the vertical stack in the second vertical opening 1170. The second conductive material 1141 may be used to separate the continuous second dielectric material on the edges of the epitaxially grown, single crystalline Si layers. In another embodiment, the second conductive material 1141 may be removed from a bottom surface of the second vertical opening 1170 to leave separate digit lines on opposing vertical surfaces of the vertical stack in the second vertical opening 1170. A portion of the second conductive material layer 1141 may be formed laterally over a top surface of the vertical stack to provide and preserve landing pads for global digit line (GDL) contacts. In one embodiment, second conductive material 1141 may serve as a liner within the second vertical opening 1170, lining the second vertical walls. In another embodiment, the second conductive material 1141 may be deposited as a solid fill within the second vertical opening 1170.

The second conductive material 1141 may be formed by depositing a titanium/titanium nitride (TiN) conductive layer via the second vertical opening 1170, to form a titanium silicide as part of the vertically oriented digit line coupled to the first source/drain regions of the horizontally oriented access devices. In some embodiments, the second conductive material 1141 may comprise a conductive metal nitride material, e.g., titanium nitride, tantalum nitride, etc. In some embodiments, the second conductive material 1141 may comprise a metal, e.g., tungsten (W), titanium (Ti), tantalum (Ta), ruthenium (Ru), cobalt (Co), molybdenum (Mo), etc., and/or a metal-semiconductor compound, e.g., tungsten silicide, cobalt silicide, titanium silicide, etc, and/or some other combination thereof.

For example, a tungsten (W) material layer may be deposited on the titanium/titanium nitride (TiN) conductive layer which forms the titanium silicide with the first source/drain regions of the horizontally oriented access devices. In another example, a cobalt (Co) material layer may be deposited on the titanium/titanium nitride (TiN) conductive layer which forms the titanium silicide with the first source/drain regions of the horizontally oriented access devices.

Figure 12:
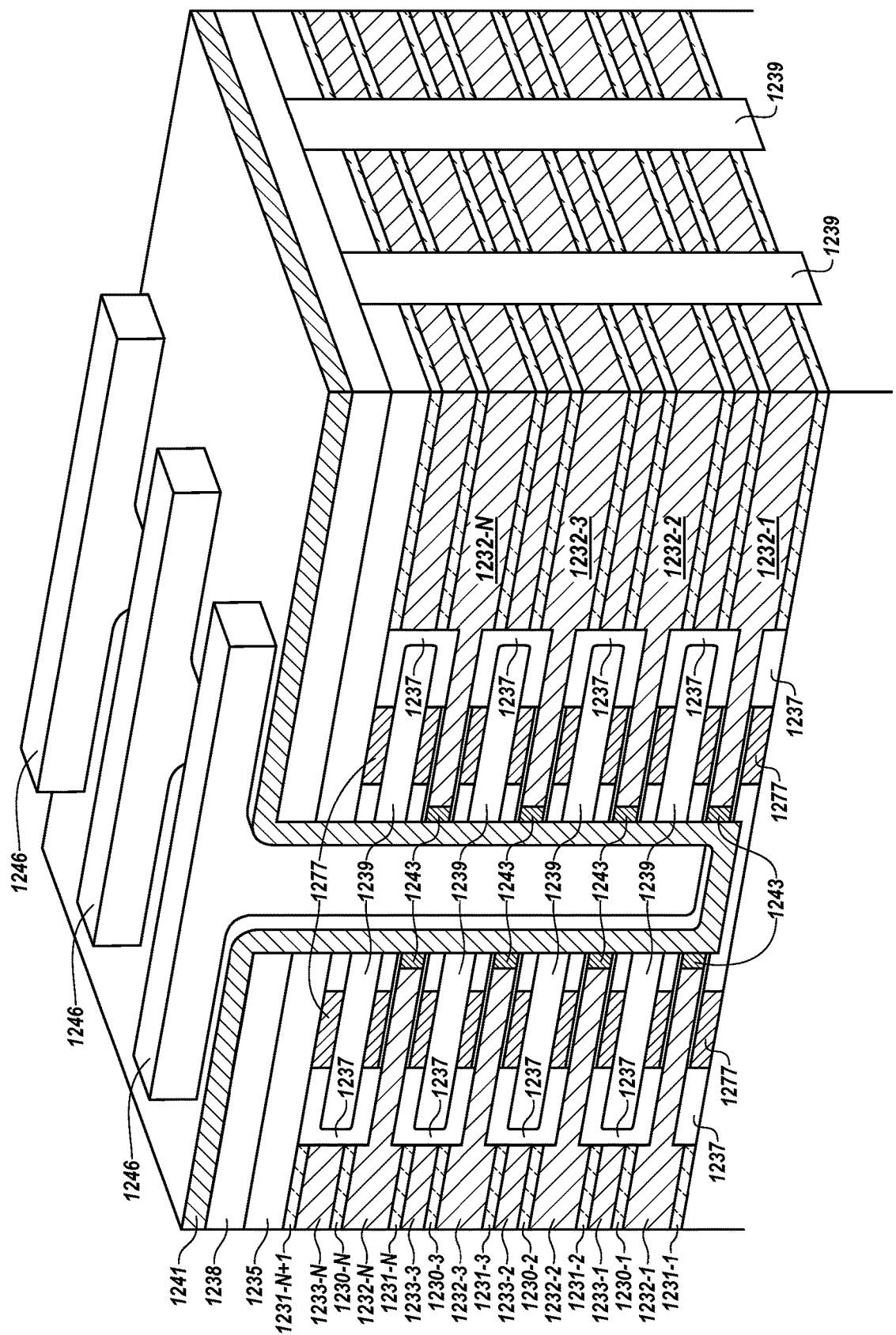

FIG. 12 illustrates a 3D cross sectional view showing a view of the semiconductor structure at this particular point in one example semiconductor fabrication process of an embodiment of the present disclosure.

As shown in the embodiment of FIG. 12, a mask material 1246 may be deposited into the second vertical opening 1270, within second conductive material 1241 and laterally over a top surface of the vertical stack to cover landing pads for the global digit line (GDL) contacts. In embodiments where the second conductive material 1241 filled the second vertical opening 1270, a portion of the second conductive material 1241 may be etched to remove the second conductive material 1241 from areas between the epitaxially grown, single crystalline Si layers 1232 and other, unmasked top surface areas of the vertical stack to separate the vertically oriented digit lines. For example, the center filling of the second conductive material 1241 may be etched prior to depositing the mask material 1246. The second conductive material 1241 may be etched using an isotropic wet etch or an isotropic vapor etch.

The mask material 1246 may be an underlayer or other suitable spin on carbon (SOC). In one embodiment, the mask material 1246 may be formed using photolithographic techniques to pattern the mask material 1246 within the second vertical opening 1270 and over the vertical stack. In one embodiment, the mask material 1246 may be used to gap fill the second vertical opening 1270 and the portion of the continuous, second conductive material layer over the top surface of the vertical stack to cover landing pads for the global digit line (GDL) contacts. The mask material 1246 may also be used to protect the second conductive material 1241 during the patterning process.

In one embodiment, the mask material 1246 may comprise a nitride material. In another embodiment, mask material 1246 may comprise a silicon nitride ($Si_3N_4$) material (also referred to herein as "SiN"). In another embodiment the mask material 1246 may include silicon dioxide ($SiO_2$) material. In another embodiment the mask material 1246 may comprise a silicon oxy-carbide (SiOxCy) material, and/or combinations thereof. Embodiments are not limited to these examples.

In another embodiment, the mask material 1246 may be formed as a liner within the second vertical opening 1270. The mask material 1246 may be formed as a fill material within the second vertical opening 1270 and the center filling of the mask material 1246 may be etched away. In this embodiment, an airgap can be left within at the center of the mask material 1246 within the second vertical opening 1270 or a third dielectric material may be deposited on the mask material 1246 within the second vertical opening 1270. The third dielectric material may be formed with a material with the same characteristics as the first dielectric material.

Figure 13:
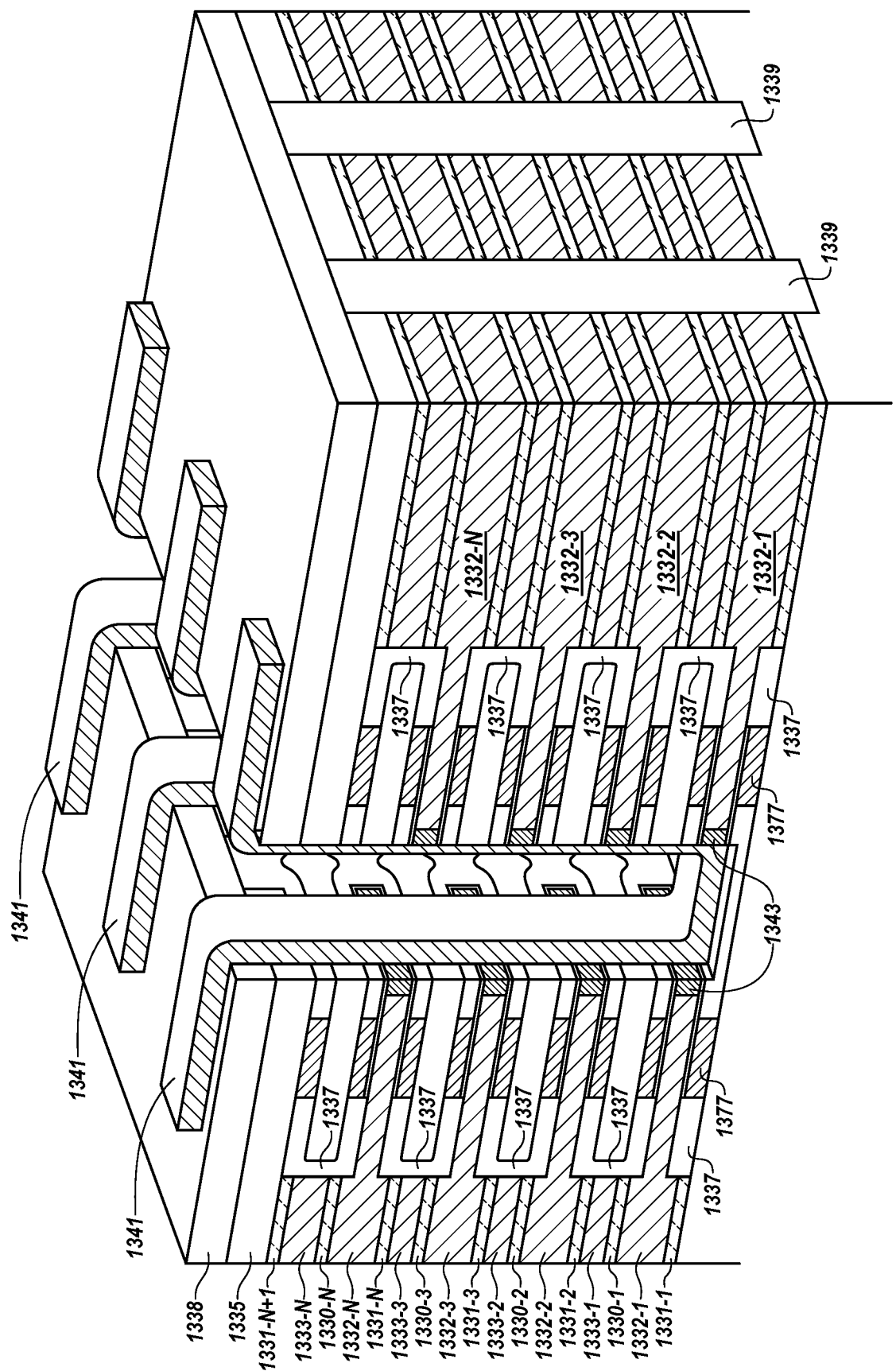

FIG. 13 illustrates a 3D cross sectional view showing a view of the semiconductor structure at this particular point in one example semiconductor fabrication process of an embodiment of the present disclosure.

In the example embodiment of FIG. 13, the mask material is etched from the second vertical openings 1370, leaving the second conductive material 1341. In some examples, the mask material may be etched in a timed selective etch, exhume process. The mask material may be selectively etched to expose sidewalls of the second conductive material 1341. The mask material may be etched using an isotropic wet etch or an isotropic vapor etch.

In one embodiment, the landing pads for the GDL contacts to land on lateral extensions of the second conductive material 1341 may be patterned on a top surface of the vertical stack. In some embodiments, the second conductive material 1341 may be removed from the top surface of the vertical stack, leaving the second conductive material 1341 within the second vertical opening 1370.

Figure 14:
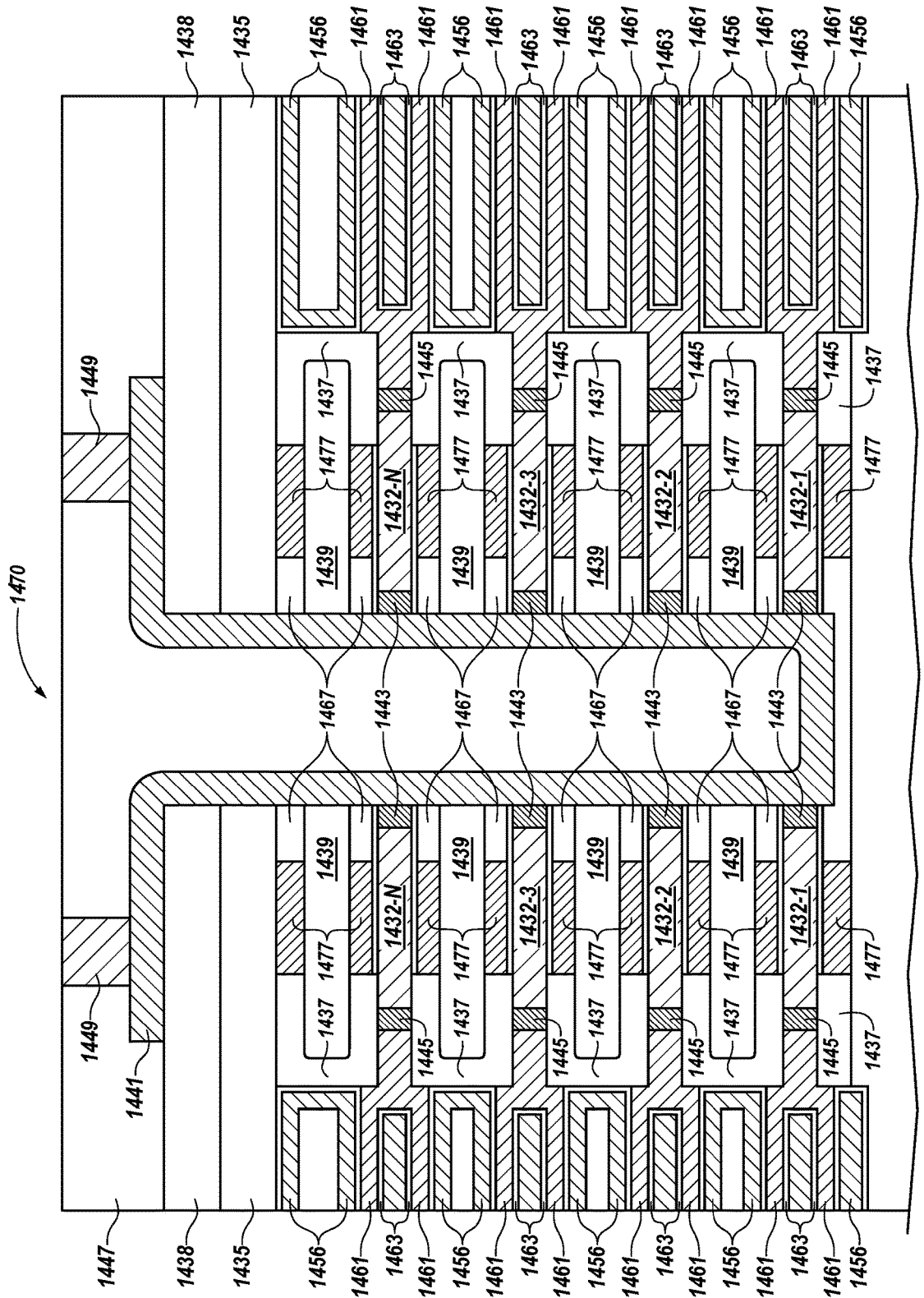
FIG. 14 illustrates an example method, at another stage of a semiconductor fabrication process in accordance with a number of embodiments of the present disclosure.

FIG. 14 illustrates an example method, at another stage of a semiconductor fabrication process in accordance with a number of embodiments of the present disclosure.

The second conductive material 1442 may be used to form multiple digit lines within the second vertical opening 1470. Two GDL contacts 1449 may be formed for each vertically oriented digit line 1442. For example, two GDL contacts 1449 may be formed for each shared, vertically oriented digit line, one on each side of the second vertical opening 1470 where the second conductive material 1441 remains such that a shared digit line between adjacent arrays has independent digit line contacts for each array. Although only two digit line contacts 1449 are illustrated, however embodiments are not so limited and multiple digit line contacts may be formed. A dielectric material 1447 may be deposited around the digit line contacts 1449.

As shown in FIG. 14, horizontally oriented storage nodes, e.g., capacitor cells, have been formed where the layers of epitaxially grown, single crystalline silicon (Si) material 1432 have been selectively etched and removed. The horizontally oriented storage nodes, e.g., capacitor cells, are illustrated as having been formed in this semiconductor fabrication process and first electrodes 1461, e.g., bottom electrodes are coupled to second source/drain regions 1445 of horizontal access devices, and second electrodes 1456, e.g., top electrodes to be coupled to a common electrode plane such as a ground plane, separated by cell dielectrics 1463, are shown. However, embodiments are not limited to this example. In other embodiments, the first electrodes 1461, e.g., bottom electrodes, coupled to second source/drain regions 1445 of horizontal access devices, and second electrodes 1456, e.g., top electrodes, coupled to a common electrode plane such as a ground plane, separated by cell dielectrics 1463, may be formed subsequent to forming a first source/drain regions (1043 in FIG. 10), a channel region, and a second source/drain region 1445 in a region of the epitaxially grown, single crystalline silicon (Si) material 1432, intended for location, e.g., placement formation, of the horizontally oriented access devices, described next.

In the example embodiment of FIG. 14, the first electrodes 1461, e.g., bottom electrodes, coupled to second source/drain regions 1445 of horizontal access devices, and second electrodes 1456 are illustrated separated by a cell dielectric material 1463 extending into and out of the plane of the drawing sheet in second direction (D2) and along an axis of orientation of the horizontal access devices and horizontal storage nodes of the arrays of vertically stacked memory cells of the three dimensional (3D) memory.

In the example embodiment of FIG. 14, the horizontally oriented storage nodes, e.g., capacitor cells, are illustrated as having been formed been formed in this semiconductor fabrication process and first electrodes 1461, e.g., bottom electrodes, coupled to source/drain regions of horizontal access devices, and second electrodes 1456, e.g., top electrodes, coupled to a common electrode plane such as a ground plane 1465, separated by cell dielectrics 1463, are shown.

Figure 15B:
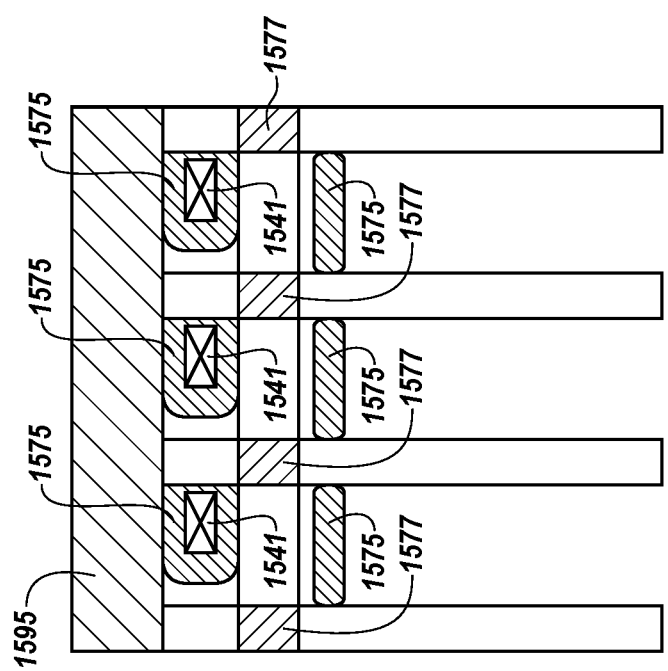
FIGS. 15A to 15B illustrate top views of example horizontally oriented access devices coupled to horizontally oriented access lines, having vertical digit lines for semiconductor devices for asymmetric and symmetric vertical digit lines, in accordance with a number of embodiments of the present disclosure.
Figure 15A:
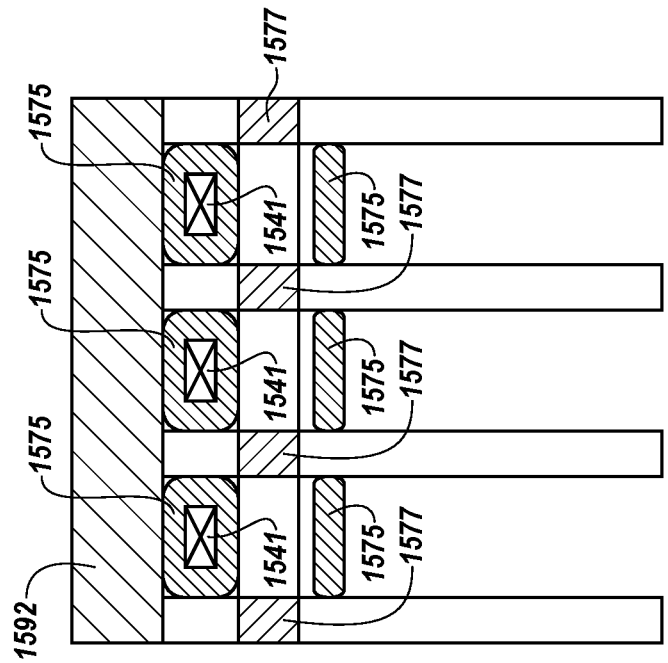

FIG. 15A illustrates an example method, at another stage of a semiconductor fabrication process, forming epitaxial silicon within horizontal access devices in vertical three dimensional (3D) memory, in accordance with a number of embodiments of the present disclosure. FIG. 15A illustrates a top down view of a semiconductor structure, at a particular point in time, in a semiconductor fabrication process, according to one or more embodiments. In the example embodiment of FIG. 15A, the method comprises using a photolithographic process to pattern the photolithographic mask 1537 where a second conductive material 1541 is asymmetric to reserve room for a body contact 1595. A second conductive material 1541 may be formed vertically through a plurality of patterned second vertical openings through the vertical stack. The vertically oriented digit lines are formed asymmetrically adjacent in electrical contact with the first source/drain regions 1543. Horizontal access lines and GAA structures are also shown opposing channel regions, separating first source/drain regions from second source/drain regions 1145.

FIG. 15B illustrates an example method, at another stage of a semiconductor fabrication process, forming epitaxial silicon within horizontal access devices in vertical three dimensional (3D) memory, in accordance with a number of embodiments of the present disclosure. FIG. 15B illustrates a top down view of a semiconductor structure, at a particular point in time, in a semiconductor fabrication process, according to one or more embodiments. In the example embodiment of FIG. 15B, the method comprises using a photolithographic process to pattern the photolithographic mask 1537 where a second conductive material 1541 is deposited symmetrically.

The second conductive material 1541 may be formed symmetrically as a vertical digit line contact. The vertically oriented digit lines are formed symmetrically, in vertical alignment, in electrical contact with the first source/drain regions 1543. The second conductive material 1541 may be formed in contact with an insulator material 1592. Second conductive material 1541 may form vertical digit lines adjacent a first source/drain region 1543. Horizontal access lines and GAA structures are also shown opposing channel regions, separating first source/drain regions from second source/drain regions 1245.

Figure 16A:
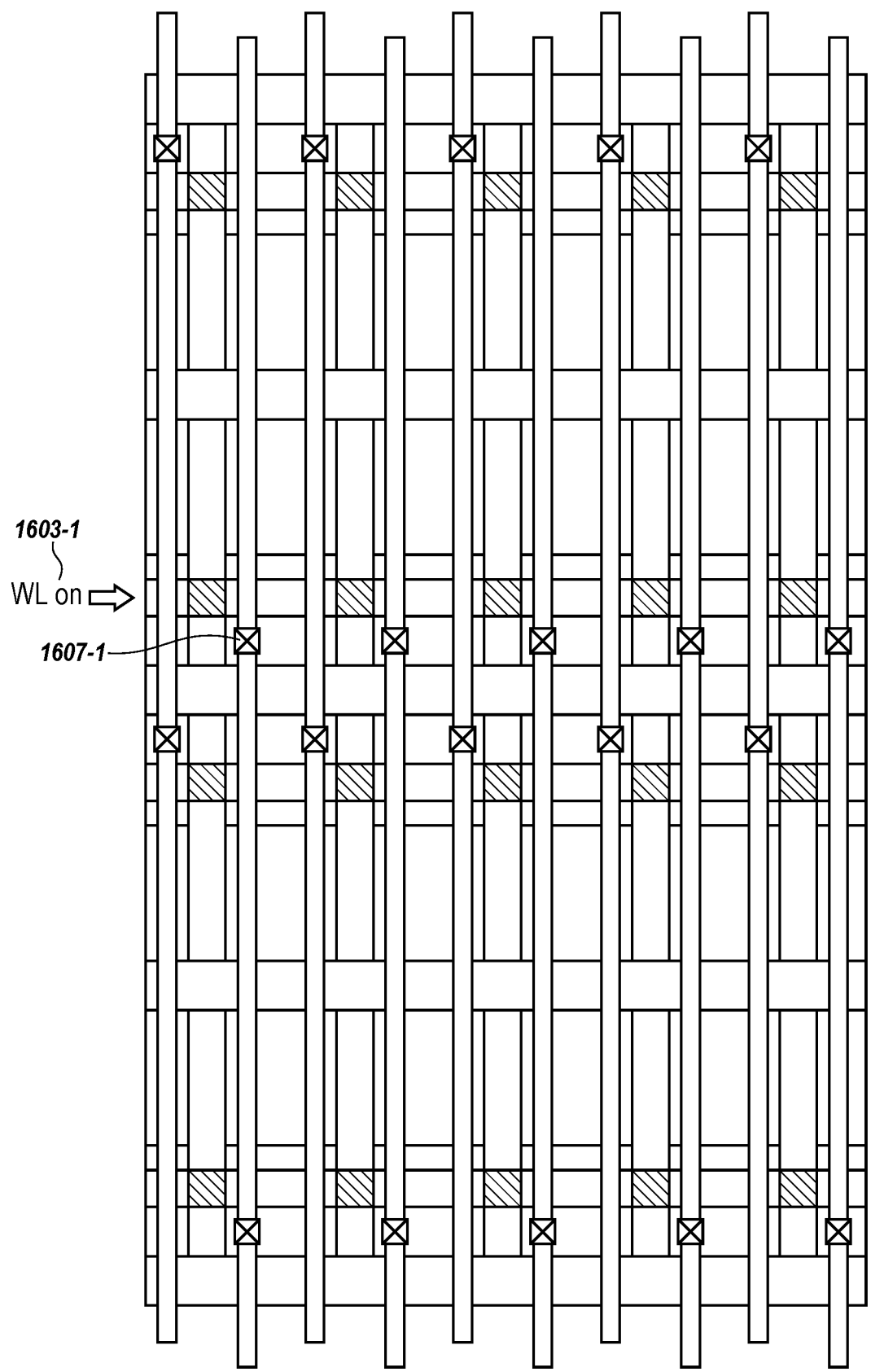
FIGS. 16A to 16B illustrate top down layout views for folded and open digit line architectures having horizontally oriented access devices coupled to horizontally oriented access lines, and having vertical digit lines for semiconductor devices, in accordance with a number of embodiments of the present disclosure.

FIG. 16A illustrates a top down layout view for a folded digit line architecture having horizontally oriented access devices coupled to horizontally oriented access lines, and having vertical digit lines for semiconductor devices, in accordance with a number of embodiments of the present disclosure. FIG. 16A illustrates a top down view of a semiconductor structure with dual vertical digit lines. As illustrated in FIG. 16A, embodiments of the present disclosure may be employed in a structure wherein the array of vertically stacked memory cells is electrically coupled in a folded digit line architecture. In a folded digit line structure, the dual structures may share a single word line 1603. A folded digit line structure may be possible when the digit lines 1607 has an odd amount of word lines 1603. A folded digit line structure may be possible when only one word line is turned on in the sub array block.

Figure 16B:
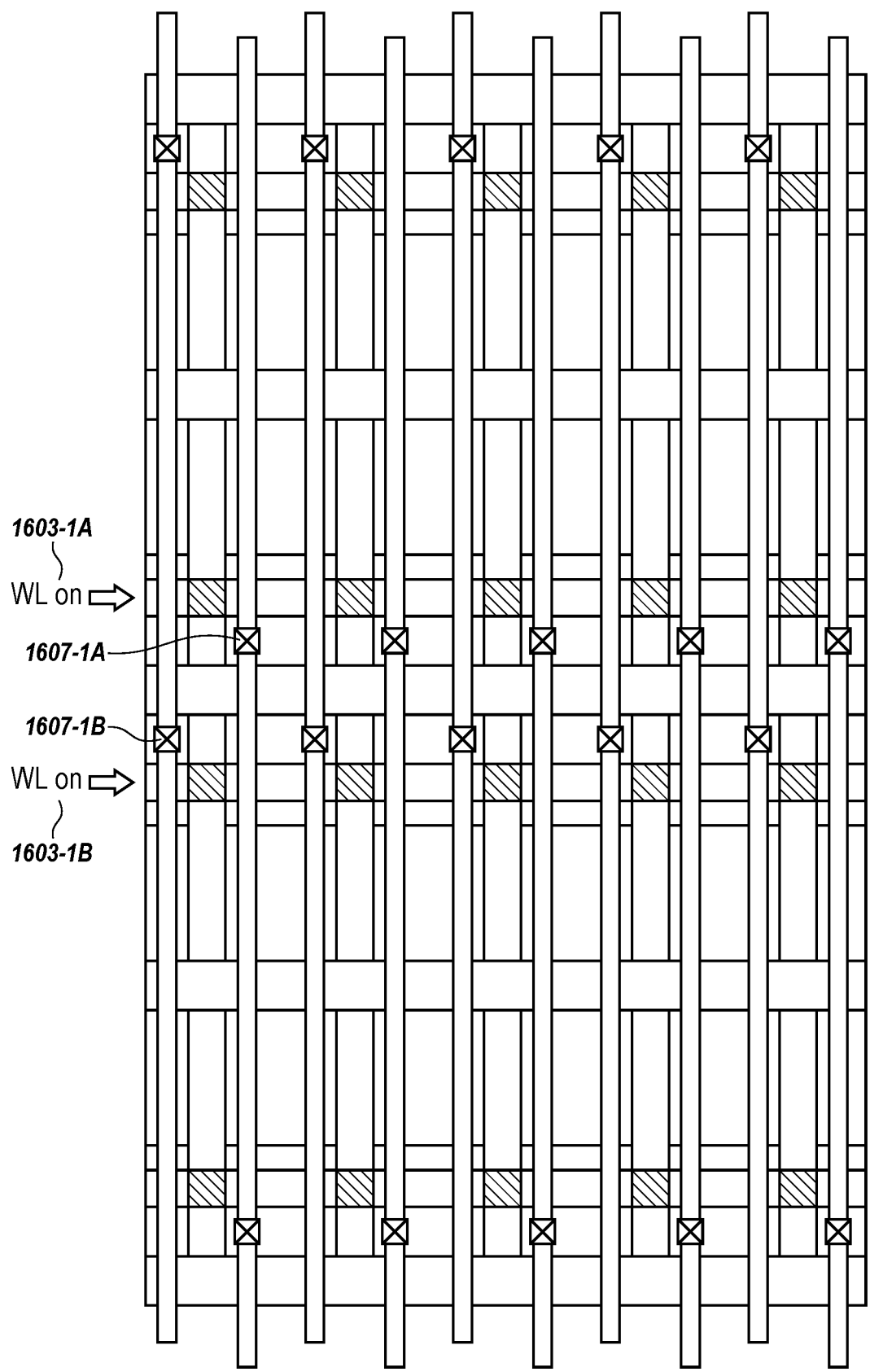

FIG. 16B illustrates an alternate top view, showing an open digit line architecture having horizontally oriented access devices coupled to horizontally oriented access lines, and having vertical digit lines for semiconductor devices, in accordance with a number of embodiments of the present disclosure. FIG. 16B illustrates a top down view of a semiconductor structure with dual vertical digit lines 1607-1A and 1607-1B. As illustrated in FIG. 16B, embodiments of the present disclosure may be employed in a structure wherein the array of vertically stacked memory cells is electrically coupled in an open digit line architecture. In an open digit line structure, each digit line structure may have its own word line 1603-1A and 1603-1B, such that a dual vertical digit line structure may have two wordlines. An open digit line structure may be possible when the digit lines 1607 has an even amount of word lines 1603. If two neighboring wordlines are turned on, only an open digit line structure may be possible; a folded digit line structure would not be possible.

Figure 17:
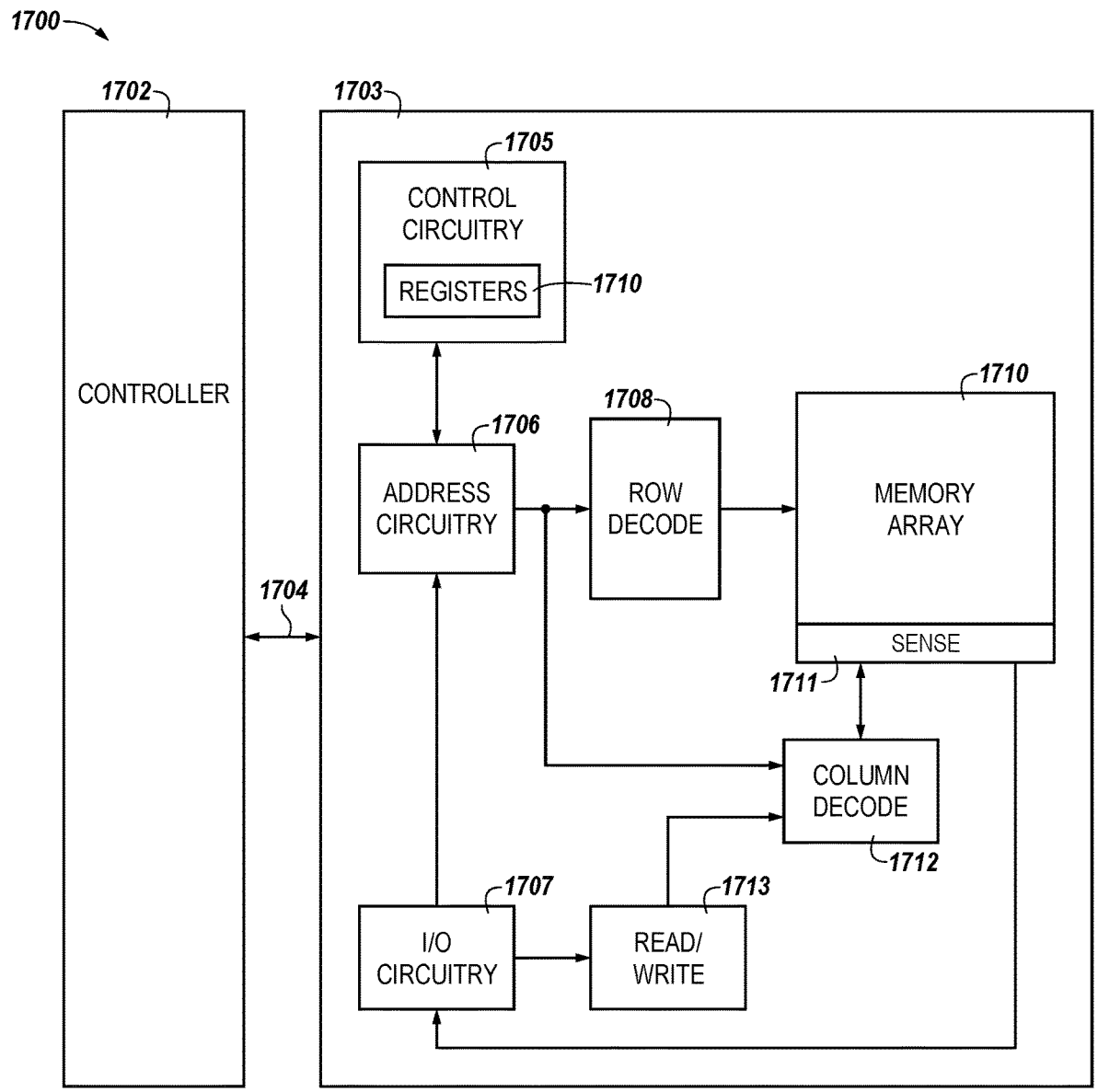
FIG. 17 is a block diagram of an apparatus in the form of a computing system including a memory device in accordance with a number of embodiments of the present disclosure.

FIG. 17 is a block diagram of an apparatus in the form of a computing system 1700 including a memory device 1703 in accordance with a number of embodiments of the present disclosure. As used herein, a memory device 1703, a memory array 1710, and/or a host 1702, for example, might also be separately considered an "apparatus." According to embodiments, the memory device 1702 may comprise at least one memory array 1710 with a memory cell formed having a digit line and body contact, according to the embodiments described herein.

In this example, system 1700 includes a host 1702 coupled to memory device 1703 via an interface 1704. The computing system 1700 can be a personal laptop computer, a desktop computer, a digital camera, a mobile telephone, a memory card reader, or an Internet-of-Things (IoT) enabled device, among various other types of systems. Host 1702 can include a number of processing resources (e.g., one or more processors, microprocessors, or some other type of controlling circuitry) capable of accessing memory 1703. The system 1700 can include separate integrated circuits, or both the host 1702 and the memory device 1703 can be on the same integrated circuit. For example, the host 1702 may be a system controller of a memory system comprising multiple memory devices 1703, with the system controller 1705 providing access to the respective memory devices 1703 by another processing resource such as a central processing unit (CPU).

In the example shown in FIG. 17, the host 1702 is responsible for executing an operating system (OS) and/or various applications (e.g., processes) that can be loaded thereto (e.g., from memory device 1703 via controller 1705). The OS and/or various applications can be loaded from the memory device 1703 by providing access commands from the host 1702 to the memory device 1703 to access the data comprising the OS and/or the various applications. The host 1702 can also access data utilized by the OS and/or various applications by providing access commands to the memory device 1703 to retrieve said data utilized in the execution of the OS and/or the various applications.

For clarity, the system 1700 has been simplified to focus on features with particular relevance to the present disclosure. The memory array 1710 can be a DRAM array comprising at least one memory cell having a digit line and body contact formed according to the techniques described herein. For example, the memory array 1710 can be an unshielded DL 4F2 array such as a 3D-DRAM memory array. The array 1710 can comprise memory cells arranged in rows coupled by word lines (which may be referred to herein as access lines or select lines) and columns coupled by digit lines (which may be referred to herein as sense lines or data lines). Although a single array 1710 is shown in FIG. 17, embodiments are not so limited. For instance, memory device 1703 may include a number of arrays 1710 (e.g., a number of banks of DRAM cells).

The memory device 1703 includes address circuitry 1706 to latch address signals provided over an interface 1704. The interface can include, for example, a physical interface employing a suitable protocol (e.g., a data bus, an address bus, and a command bus, or a combined data/address/command bus). Such protocol may be custom or proprietary, or the interface 1704 may employ a standardized protocol, such as Peripheral Component Interconnect Express (PCIe), Gen-Z, CCIX, or the like. Address signals are received and decoded by a row decoder 1708 and a column decoder 1712 to access the memory array 1710. Data can be read from memory array 1710 by sensing voltage and/or current changes on the sense lines using sensing circuitry 1711. The sensing circuitry 1711 can comprise, for example, sense amplifiers that can read and latch a page (e.g., row) of data from the memory array 1710. The I/O circuitry 1707 can be used for bi-directional data communication with the host 1702 over the interface 1704. The read/write circuitry 1713 is used to write data to the memory array 1710 or read data from the memory array 1710. As an example, the circuitry 1713 can comprise various drivers, latch circuitry, etc.

Control circuitry 1705 decodes signals provided by the host 1702. The signals can be commands provided by the host 1702. These signals can include chip enable signals, write enable signals, and address latch signals that are used to control operations performed on the memory array 1710, including data read operations, data write operations, and data erase operations. In various embodiments, the control circuitry 1705 is responsible for executing instructions from the host 1702. The control circuitry 1705 can comprise a state machine, a sequencer, and/or some other type of control circuitry, which may be implemented in the form of hardware, firmware, or software, or any combination of the three. In some examples, the host 1702 can be a controller external to the memory device 1703. For example, the host 1702 can be a memory controller which is coupled to a processing resource of a computing device.

The term semiconductor can refer to, for example, a material, a wafer, or a substrate, and includes any base semiconductor structure. "Semiconductor" is to be understood as including silicon-on-sapphire (SOS) technology, silicon-on-insulator (SOI) technology, thin-film-transistor (TFT) technology, doped and undoped semiconductors, epitaxial silicon supported by a base semiconductor structure, as well as other semiconductor structures. Furthermore, when reference is made to a semiconductor in the preceding description, previous process steps may have been utilized to form regions/junctions in the base semiconductor structure, and the term semiconductor can include the underlying materials containing such regions/junctions.

The figures herein follow a numbering convention in which the first digit or digits correspond to the drawing figure number and the remaining digits identify an element or component in the drawing. Similar (e.g., the same) elements or components between different figures may be identified by the use of similar digits. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate the embodiments of the present disclosure and should not be taken in a limiting sense.

As used herein, "a number of" or a "quantity of" something can refer to one or more of such things. For example, a number of or a quantity of memory cells can refer to one or more memory cells. A "plurality" of something intends two or more. As used herein, multiple acts being performed concurrently refers to acts overlapping, at least in part, over a particular time period. As used herein, the term "coupled" may include electrically coupled, directly coupled, and/or directly connected with no intervening elements (e.g., by direct physical contact), indirectly coupled and/or connected with intervening elements, or wirelessly coupled. The term coupled may further include two or more elements that co-operate or interact with each other (e.g., as in a cause and effect relationship). An element coupled between two elements can be between the two elements and coupled to each of the two elements.

It should be recognized the term vertical accounts for variations from "exactly" vertical due to routine manufacturing, measuring, and/or assembly variations and that one of ordinary skill in the art would know what is meant by the term "perpendicular." For example, the vertical can correspond to the z-direction. As used herein, when a particular element is "adjacent to" an other element, the particular element can cover the other element, can be over the other element or lateral to the other element and/or can be in direct physical contact the other element. Lateral to may refer to the horizontal direction (e.g., the y-direction or the x-direction) that may be perpendicular to the z-direction, for example.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

What is claimed is:

1. A memory device comprising:
a vertical stack of memory cells formed in tiers, the stack having a respective horizontally oriented access device and a respective storage node in each tier, the horizontally oriented access devices having first source/drain regions and second source drain regions separated by epitaxially grown, single crystalline channel regions; the horizontally oriented storage node of a respective tier being electrically coupled to the second source/drain region of the horizontally oriented access device of the respective tier;
and a vertically oriented digit line electrically coupled to the first source/drain regions of the horizontally oriented access devices, wherein the vertical digit line comprises a structure with a U-shaped outer surface formed in a trench adjacent to the first source/drain regions of the horizontally oriented access devices of the stack.

2. The device of claim 1 wherein the structure comprises a line of conductive material that is continuous across a bottom of the trench.

3. The device of claim 2, wherein the continuous conductive material comprises a titanium/titanium nitride (TiN) conductive layer, via the second vertical opening, to form a titanium silicide as part of the vertically oriented digit line coupled to the first source/drain regions.

4. The device of claim 3, wherein the continuous conductive material comprises a tungsten (W) material layer on the titanium/titanium nitride (TiN) conductive layer which forms the titanium silicide with the first source/drain regions of the horizontally oriented access devices.

5. The device of claim 3, wherein the continuous conductive material comprises a cobalt (Co) material layer on the titanium/titanium nitride (TiN) conductive layer which forms the titanium silicide with the first source/drain regions of the horizontally oriented access devices.

6. The device of claim 2, wherein the continuous conductive material extends laterally over a top surface of the vertical stack to provide landing pads for global digit line (GDL) contacts.

7. The device of claim 6, further comprising:
a first dielectric material through the vertical stack;
a second dielectric material adjacent the first dielectric material within the trench to gap fill the trench and over the portion of the continuous conductive material over the top surface of the vertical stack to cover the landing pads for the global digit line (GDL) contacts.

8. The device of claim 2, wherein the continuous conductive material is etched using an isotropic etch from areas between epitaxially grown, single crystalline Si layers within the vertical stack.

9. A memory device comprising:
a vertical stack of memory cells formed in tiers, the stack having a respective horizontally oriented access device and a respective storage node in each tier, the horizontally oriented access devices having first source/drain regions and second source drain regions separated by epitaxially grown, single crystalline channel regions; the horizontally oriented storage node of a respective tier being electrically coupled to the second source/drain region of the horizontally oriented access device of the respective tier; and
first and second vertically oriented digit lines formed in a trench adjacent to the first source/drain regions of the horizontally oriented access devices of the stack, wherein the first digit line is electrically coupled to the first source/drain regions of the horizontally oriented access devices of the stack and the second digit line is electrically isolated from the first digit line at the bottom of the trench.

10. The device of claim 9, further comprising a silicon nitride (SiN) material on an inner surface of the structure in the trench.

11. The device of claim 10, further comprising a dielectric material between opposing surfaces of the SiN in the trench.

12. The device of claim 10, further comprising an airgap between opposing surfaces of the SiN in the trench.

13. The device of claim 9, further comprising a mask material over the first and second vertically oriented digit lines.

14. The device of claim 9, wherein the first and second vertically oriented digit lines are a solid fill within the trench.

15. The device of claim 9, further comprising horizontally oriented capacitor cells having a bottom electrode formed in electrical contact with the second source/drain region.

16. A method for forming arrays of vertically stacked memory cells, having horizontally oriented access devices and storage node capacitors, comprising:
epitaxially forming multiple, alternating layers of silicon germanium (SiGe) layers and single crystalline silicon (Si) layers to form a vertical stack;
forming a plurality of first vertical openings, having a first horizontal direction and a second horizontal direction, through the vertical stack, the first vertical openings extending predominantly in the second horizontal direction to form elongated vertical, pillar columns with first vertical sidewalls in the stack;
forming a first dielectric material in the plurality of first vertical openings;
forming a second vertical opening through the vertical stack and extending predominantly in the first horizontal direction to expose second vertical sidewalls adjacent a first region of the epitaxially grown SiGe layers and Si layers;
removing a portion of the epitaxially grown SiGe layers in the second horizontal direction to form a plurality of first horizontal openings;
depositing a first conductive material on a gate dielectric material on exposed surfaces of remaining epitaxially formed, single crystalline Si layers;
forming a second dielectric material in the second vertical opening;

selectively etching the second dielectric material to expose edges of the epitaxially grown, single crystalline Si layers in the vertical stack; and conformally depositing a second conductive material continuously along the second vertical sidewalls of the second vertical opening on the edges of the epitaxially grown, single crystalline Si layers in electrical contact with first source/drain regions and continuously across a bottom surface of the second vertical opening to form shared vertically oriented digit lines.

17. The method of claim 16, wherein the method further comprises forming multiple digit line contacts for each shared, vertically oriented digit line, one on each side of the second vertical opening.

18. The method of claim 16, wherein depositing the second conductive material in the second vertical opening comprises forming the digit lines continuously along a bottom surface of the second vertical opening to form shared digit lines between horizontal access devices, in two separate arrays, on opposing second vertical surfaces of the vertical stack in the second vertical opening.

19. The method of claim 16, further comprising:
filling the second vertical opening with a mask material;
patterning landing pads for global digit line (GDL) contacts to land on lateral extensions of the second conductive material on a top surface of the vertical stack;
forming two GDL contacts for each vertically oriented digit line, one on each side of the second vertical opening where the second conductive material remains such that a shared digit line between adjacent arrays has independent digit line contacts for each array.

20. The method of claim 16, further comprising forming a second horizontal openings through etched SiGe layers to form storage node regions.

21. The method of claim 16, wherein forming the first dielectric material from one of a silicon boron nitride material (SiBN), a silicon oxide carbide material (SiOC), and a silicon carbon nitride material (SiCN).

22. The method of claim 16, wherein depositing a first conductive material comprises depositing the first conductive material fully around every surface of the Si material, to form gate all around (GAA) gate structures, opposing channel regions.

* * * * *